United States Patent
Fukuda

(10) Patent No.: US 10,574,916 B2
(45) Date of Patent: Feb. 25, 2020

(54) IMAGE PROCESSING APPARATUS, IMAGE CAPTURING APPARATUS, IMAGE PROCESSING METHOD, AND COMPUTER-READABLE STORAGE MEDIUM

(71) Applicant: CANON KABUSHIKI KAISHA, Tokyo (JP)

(72) Inventor: Koichi Fukuda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 302 days.

(21) Appl. No.: 15/611,230

(22) Filed: Jun. 1, 2017

(65) Prior Publication Data

US 2017/0353680 A1 Dec. 7, 2017

(30) Foreign Application Priority Data

Jun. 3, 2016 (JP) .................................. 2016-112101
Jul. 21, 2016 (JP) .................................. 2016-143735

(51) Int. Cl.
*H04N 5/367* (2011.01)
*H04N 5/374* (2011.01)
*H04N 5/378* (2011.01)

(52) U.S. Cl.
CPC ............. *H04N 5/367* (2013.01); *H04N 5/374* (2013.01); *H04N 5/378* (2013.01)

(58) Field of Classification Search
CPC ......................... G02B 7/34–346; G03B 13/20; G01J 9/00–04
USPC ................. 382/274; 396/128, 114; 356/3.13; 348/46, 349
See application file for complete search history.

(56) References Cited

U.S. PATENT DOCUMENTS

| 4,410,804 A | 10/1983 | Stauffer |
| 2006/0274170 A1 | 12/2006 | Azuma |

(Continued)

FOREIGN PATENT DOCUMENTS

| CN | 101372179 A | 2/2009 |
| CN | 102509271 A | 6/2012 |

(Continued)

OTHER PUBLICATIONS

Nov. 21, 2017 European Patent Office partial Search Report, which is enclosed, that issued in European Patent Application No. 17172362.0.

(Continued)

*Primary Examiner* — Xi Wang
(74) *Attorney, Agent, or Firm* — Cowan, Liebowitz & Latman, P.C.

(57) ABSTRACT

An image processing apparatus comprises: an acquisition unit configured to acquire a first viewpoint image corresponding to a first partial pupil region of an exit pupil of as imaging optical system divided into a plurality of partial pupil regions in a first direction, and a captured image corresponding to the exit pupil; and a correction unit configured to correct shading of a first pixel of a first pixel group based on a first ratio of a sum of the first pixel group of the first viewpoint image arranged in a second direction orthogonal to the first direction to a sum of a pixel group of the captured image corresponding to a position of the first pixel group.

16 Claims, 20 Drawing Sheets

(56) References Cited

U.S. PATENT DOCUMENTS

| | | | | |
|---|---|---|---|---|
| 2010/0013947 | A1* | 1/2010 | Oikawa | G03B 13/36 |
| | | | | 348/222.1 |
| 2014/0204178 | A1* | 7/2014 | Kawai | G03B 35/08 |
| | | | | 348/46 |
| 2014/0253787 | A1 | 9/2014 | Shu et al. | |

FOREIGN PATENT DOCUMENTS

| | | | |
|---|---|---|---|
| CN | 103748873 | A | 4/2014 |
| EP | 2747429 | A1 | 6/2014 |
| JP | 58-024105 | A | 2/1983 |
| JP | 2001-083407 | A | 3/2001 |
| JP | 2013-145979 | A | 7/2013 |
| WO | 2013/027513 | A | 2/2013 |
| WO | 2014/156202 | A | 10/2014 |

OTHER PUBLICATIONS

Jul. 16, 2019 Chinese Office Action, which is enclosed with an English Translation, that issued in Chinese Patent Application No. 201710372375.4.

The above foreign patent document was dated Jan. 10, 2020 Japanese Office Action, a copy of which is enclosed without an English Translation, that issued in Japanese Patent Application No. 2016112101.

* cited by examiner

PLAN VIEW a - a SECTIONAL VIEW

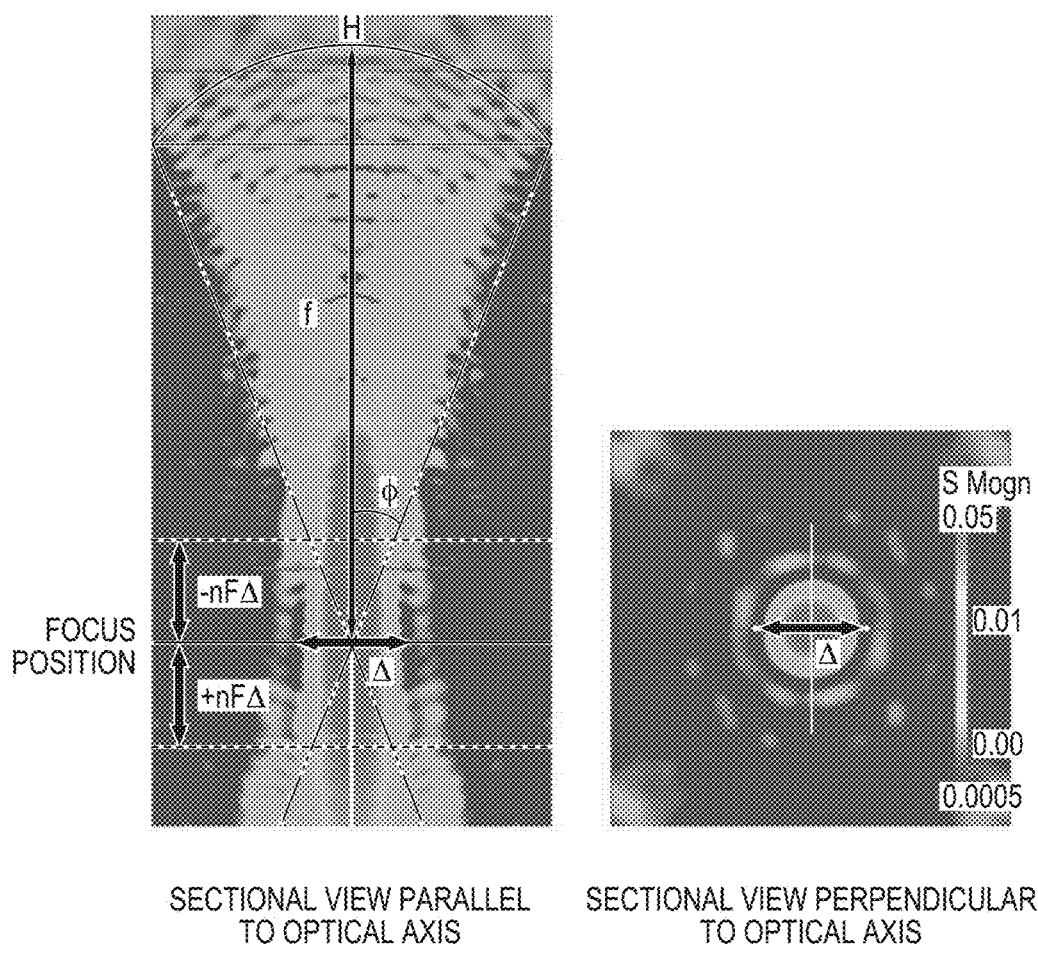
SECTIONAL VIEW PARALLEL
TO OPTICAL AXIS
SECTIONAL VIEW PERPENDICULAR
TO OPTICAL AXIS
F I G. 5A
F I G. 5B

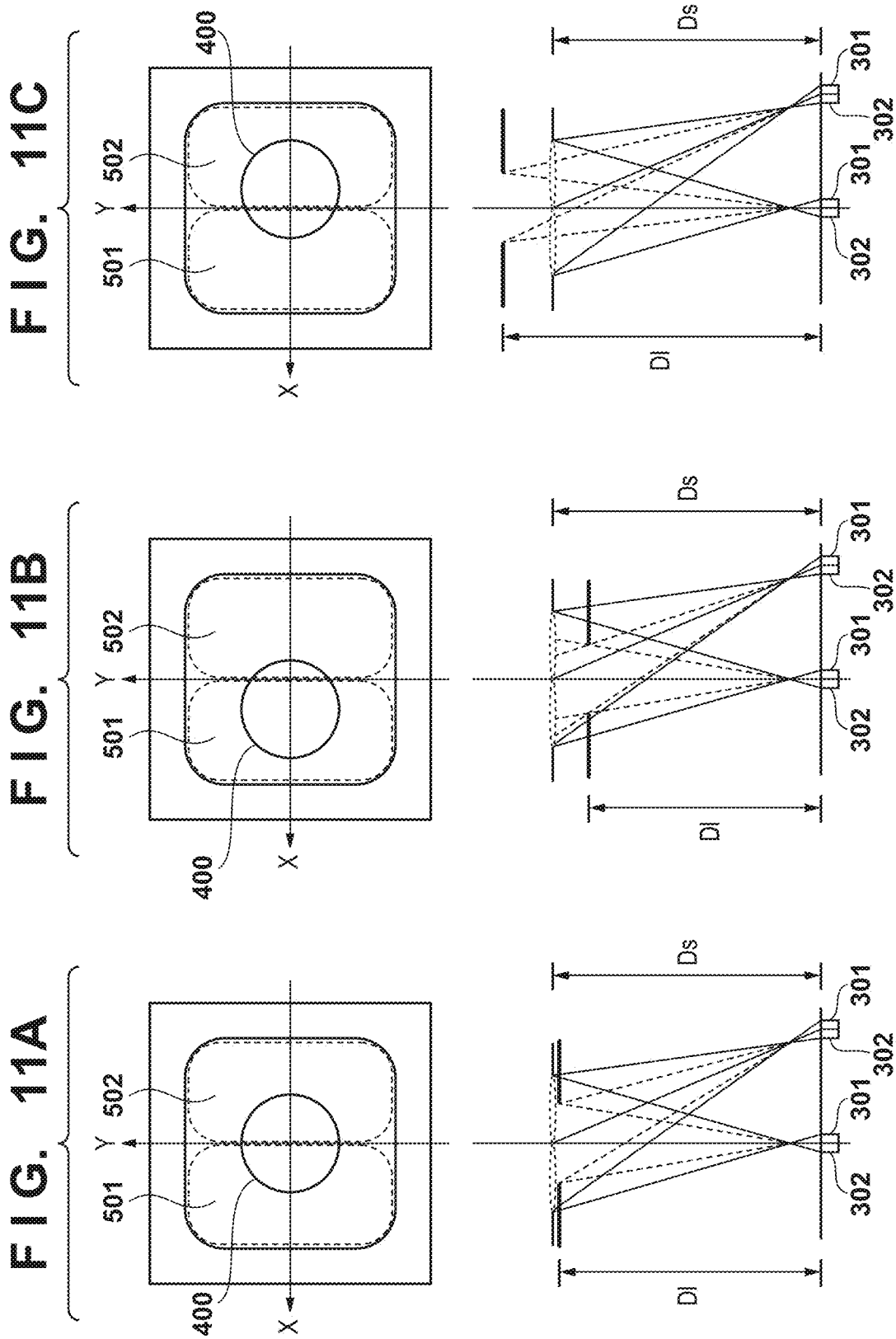

F I G. 19

PLAN VIEW a - a SECTIONAL VIEW

IMAGE PROCESSING APPARATUS, IMAGE CAPTURING APPARATUS, IMAGE PROCESSING METHOD, AND COMPUTER-READABLE STORAGE MEDIUM

BACKGROUND OF THE INVENTION

Field of the Invention

The present invention relates to an image processing apparatus, an image capturing apparatus, an image processing method, and a computer-readable storage medium.

Description of the Related Art

As one of focus detection methods for an image capturing apparatus, there is an imaging plane phase difference method of performing phase difference focus detection using focus detection pixels formed in an image sensor. An image capturing apparatus disclosed in Japanese Patent Laid-Open No. 58-024105 uses a two-dimensional image sensor in which one microlens and a plurality of divided photoelectric conversion units are formed in correspondence with one pixel. The plurality of divided photoelectric conversion units are configured to receive light from different regions of the exit pupil of an imaging lens via the one microlens to divide the pupil. For each of the plurality of divided photoelectric conversion units, a viewpoint signal is generated from the light reception signal. An image shift amount is calculated from the parallax between the plurality of viewpoint signals and converted into a defocus amount, thereby performing the phase difference focus detection. Japanese Patent Laid-Open No. 2001-083407 discloses generating an imaging signal by adding a plurality of viewpoint signals from light reception signals of a plurality of divided photoelectric conversion units. Note that a plurality of viewpoint signals concerning a captured image are equivalent to LF (Light Field) data that is the information of the spatial distribution and angular distribution of light intensities.

In some regions of the plurality of viewpoint images obtained by the image capturing apparatuses disclosed in Japanese Patent Laid-Open Nos. 58-024105 and 2001-083407, a flaw signal, shading caused by pupil division, a saturation signal, or the like may be generated, resulting in degradation of the image quality of the viewpoint images.

SUMMARY OF THE INVENTION

The present invention has been made in consideration of the aforementioned problems, and realizes a technique of improving the quality of a viewpoint image.

In order to solve the aforementioned problems, one aspect of the present invention provides an image processing apparatus comprising: an acquisition unit configured to acquire a first viewpoint image corresponding to a first partial pupil region of an exit pupil of an imaging optical system divided into a plurality of partial pupil regions in a first direction, and a captured image corresponding to the exit pupil; and a correction unit configured to correct shading of a first pixel of a first pixel group based on a first ratio of a sum of the first pixel group of the first viewpoint image arranged in a second direction orthogonal to the first direction to a sum of a pixel group of the captured image corresponding to a position of the first pixel group.

Another aspect of the present invention provides, an image capturing apparatus comprising: an image sensor in which a plurality of pixels each including a plurality of sub-pixels each configured to receive a light beam corresponding to a different partial pupil region of an exit pupil of an imaging optical system divided into a plurality of partial pupil regions in a first direction are arrayed; an acquisition unit configured to acquire a first viewpoint image corresponding to a first partial pupil region of the exit pupil, and a captured image corresponding to the exit pupil; and a correction unit configured to correct shading of a first pixel of a first pixel group based on a first ratio of a sum of the first pixel group of the first viewpoint image arranged is a second direction orthogonal to the first direction to a sum of a pixel group of the captured image corresponding to a position of the first pixel group.

Still another aspect of the present invention provides, an image processing apparatus comprising a processor coupled to a memory for performing an image-processing program comprising sets for instructions for: acquiring a first viewpoint image corresponding to a first partial pupil region of an exit pupil of an imaging optical system divided into a plurality of partial pupil regions in a first direction, and a captured image corresponding to the exit pupil; and correcting shading of a first pixel of a first pixel group based on a first ratio of a sum of the first pixel group of the first viewpoint image arranged in a second direction orthogonal to the first direction to a sum of a pixel group of the captured image corresponding to a position of the first pixel group.

Yet another aspect of the present invention provides, an image processing method in which an image processing apparatus performs, the method having: acquiring a first viewpoint image corresponding to a first partial pupil region of an exit pupil of an imaging optical system divided into a plurality of partial pupil regions in a first direction, and a captured image corresponding to the exit pupil; and correcting shading of a first pixel of a first pixel group based on a first ratio of a sum of the first pixel group of the first viewpoint image arranged in a second direction orthogonal to the first direction to a sum of a pixel group of the captured image corresponding to a position of the first pixel group.

Still yet another aspect of the present invention provides, a non-transitory computer-readable storage medium storing a program for causing a computer to execute a control method of an image processing apparatus having: acquiring a first viewpoint image corresponding to a first partial pupil region of an exit pupil of an imaging optical system divided into a plurality of partial pupil regions in a first direction, and a captured image corresponding to the exit pupil; and correcting shading of a first pixel of a first pixel group based on a first ratio of a sum of the first pixel group of the first viewpoint image arranged in a second direction orthogonal to the first direction to a sum of a pixel group of the captured image corresponding to a position of the first pixel group.

According to the present invention, it is possible to improve the quality of a viewpoint image.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 5A is a view showing a light intensity distribution on a section parallel to the optical axis of a microlens;

FIG. 5B is a view showing a light intensity distribution on a section perpendicular to the optical axis of a microlens;

FIGS. 11A to 11C are views for explaining shading caused by the pupil shift between the first viewpoint image and the second viewpoint image;

FIG. 19 is a view showing an example of a final corrected second viewpoint image $MI_2$ after shading correction;

DESCRIPTION OF THE EMBODIMENTS

The embodiments of the present invention will now be described with reference to the accompanying drawings. It should be noted that the technical scope of the present invention is not limited by the following individual embodiments but by the appended claims. In addition, not all the combinations of features described in the embodiments are necessarily essential to the present invention.

In each of the following embodiments, as image capturing apparatus such as a digital camera will be described as an example of an image processing apparatus. However, the image processing apparatus is not limited to the image capturing apparatus, and may be an image processing apparatus of another type (for example, a personal computer).

First Embodiment

Arrangement of Image Capturing Apparatus 100

Figure 1:
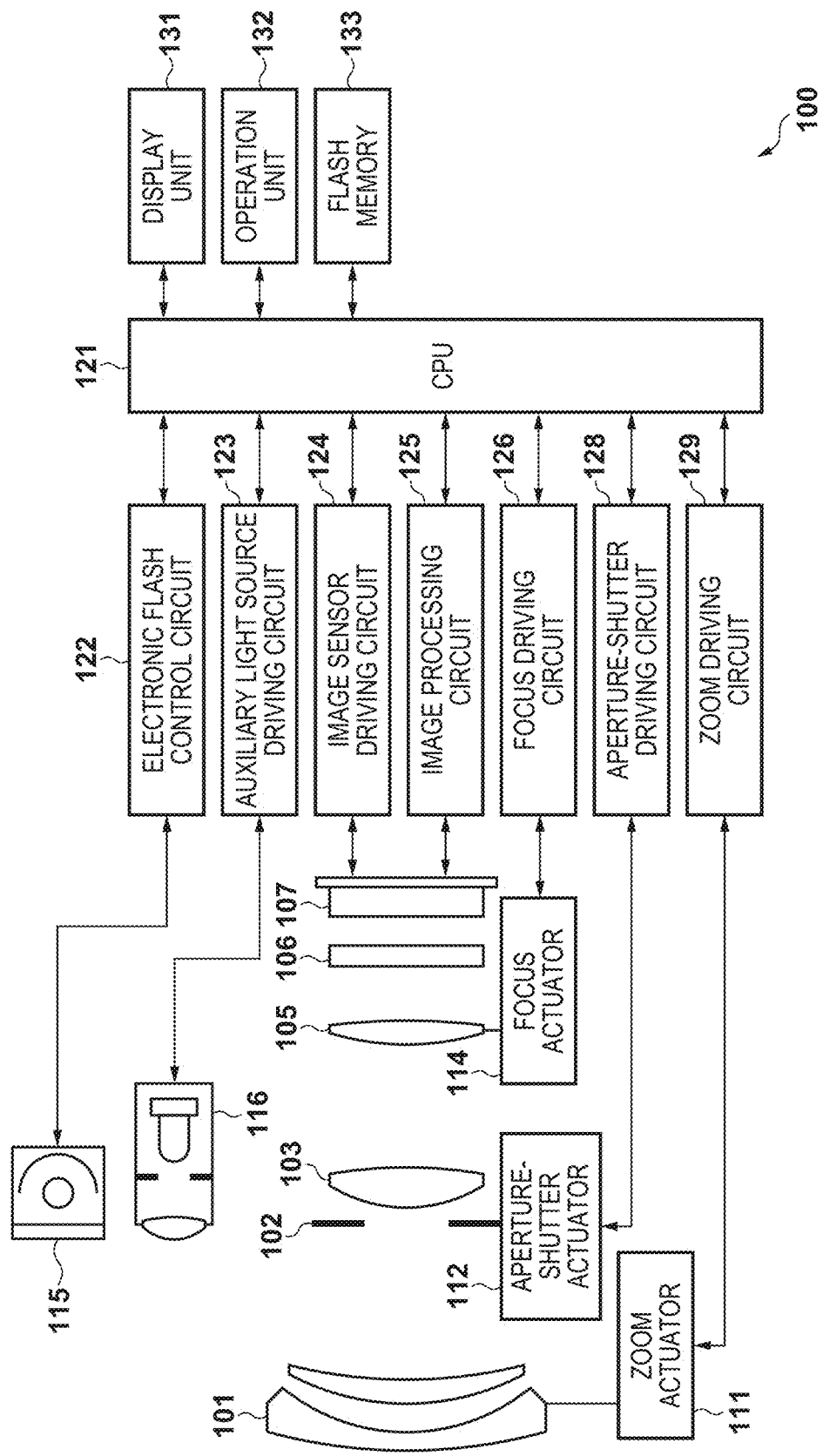
FIG. 1 is a block diagram showing an arrangement of an image capturing apparatus 100.

FIG. 1 is a block diagram showing an arrangement of an image capturing apparatus 100. A first lens group 101 arranged at the distal end of an image capturing optical system (imaging optical system) is held by a lens barrel to be reciprocally movable in the optical axis direction. An aperture-shutter 102 adjusts its opening diameter, thereby adjusting the light amount in shooting. The aperture-shutter 102 also has a function as an exposure time adjusting shutter in still image shooting. A second lens group 103 reciprocally moves in the optical axis direction integrally with the aperture-shutter 102 and performs a magnification operation (zoom operation) in synchronism with the reciprocal moving operation of the first lens group 101. A third lens group 105 is a focus lens that adjusts focus by reciprocally moving in the optical axis direction. An optical low-pass filter 106 is an optical element configured to reduce a false color or moiré of a captured image. An image sensor 107 is formed from, for example, a two-dimensional CMOS (Complementary Metal-Oxide Semiconductor) photosensor and peripheral circuits and is arranged on the imaging plane of the imaging optical system.

A zoom actuator 111 rotates a cam cylinder (not shown) to move the first lens group 101 and the second lens group 103 in the optical axis direction, thereby performing the magnification operation. An aperture-shutter actuator 112 controls the opening diameter of the aperture-shutter 102 to adjust the shooting light amount, and also performs exposure time control in still image shooting. A focus actuator 114 moves the third lens group 105 in the optical axis direction to perform a focus adjusting operation.

An electronic flash 115 for object illumination is used at the time of shooting. As the electronic flash 115, a flash illumination device using a xenon tube or an illumination device including an LED (Light-Emitting Diode) that continuously emits light is used. An AF auxiliary light source 116 (auto focus auxiliary light source) projects the image of a mask with a predetermined opening pattern to a field via a projecting lens. This improves the focus detection capability for a low-luminance object or a low-contrast object.

A CPU (Central Processing Unit) 121 that constitutes the control unit of the main body of the image capturing apparatus 100 has a control center function of performing various kinds of control. The CPU 121 includes an operation unit, a ROM (Read Only Memory), a RAM (random access memory), an A (analog)/D (digital) converter, a D/A converter, a communication interface circuit, and the like. The CPU 121 drives various kinds of circuits in the image capturing apparatus 100 in accordance with a predetermined program stored in the ROM, and executes a series of operations such as AF control, image capturing processing, image processing, and record processing.

According to a control instruction from the CPU 121, an electronic flash control circuit 122 on-controls the electronic flash 115 in synchronism with a shooting operation. According to a control instruction from the CPU 121, an auxiliary light source driving circuit 123 on-controls the AF auxiliary light source 116 in synchronism with a focus detection operation. An image sensor driving circuit 124 controls the imaging operation of the image sensor 107, and also A/D-converts an acquired imaging signal and transmits the signal to the CPU 121. According to a control instruction from the CPU 121, an image processing circuit 125 performs processes such as gamma conversion, color interpolation, and JPEG (Joint Photographic Experts Group) compression for the image acquired by the image sensor 107.

According to a control instruction from the CPU 121, a focus driving circuit 126 drives the focus actuator 114 based on a focus detection result and moves the third lens group 105 in the optical axis direction, thereby adjusting focus. According to a control instruction from the CPU 121, an aperture-shutter driving circuit 128 drives the aperture-shutter actuator 112, thereby controlling the opening diameter of the aperture-shutter 102. According to a control instruction from the CPU 121, a zoom driving circuit 129 drives the zoom actuator 111 based on a zoom operation instruction of the user.

A display unit 131 includes a display device such as an LCD (liquid crystal display), and displays information about the shooting mode of the image capturing apparatus 100, a preview image before shooting, a confirmation image after shooting, an in-focus display image at the time of focus detection, and the like. An operation unit 132 includes a power switch, a release (shooting trigger) switch, a zoom operation switch, a shooting mode selection switch, and the like as operation switches, and outputs an operation instruction signal to the CPU 121. A flash memory 133 is a storage medium detachable from the main body of the image capturing apparatus 100, and records shot image data and the like.

Arrangement of Image Sensor 107

Figure 2:
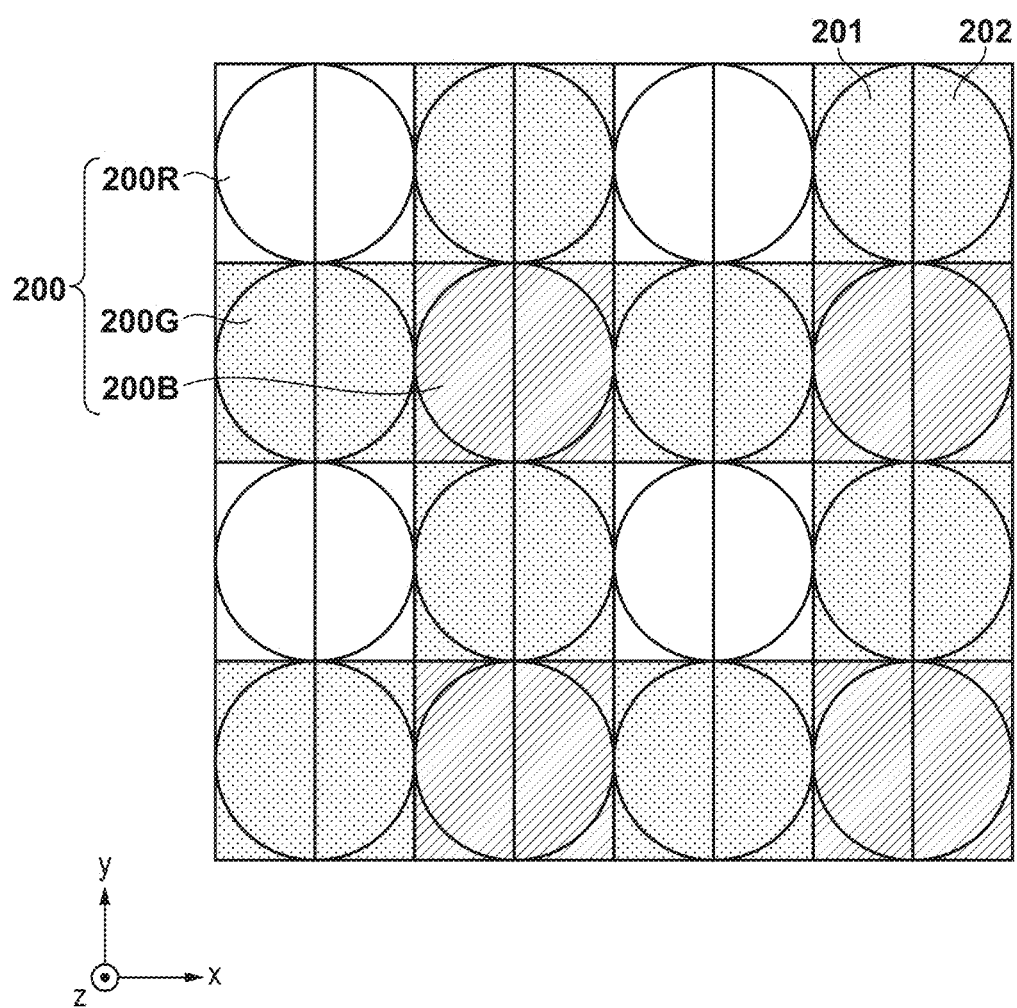
FIG. 2 is a schematic view of the array of the pixels and sub-pixels of as image sensor 107 according to the first embodiment.

FIG. 2 is a schematic view of the array of the pixels and sub-pixels of the image sensor 107. The left-and-right direction of FIG. 2 is defined as an x direction (horizontal direction), the top-and-bottom direction as a y direction (vertical direction), and a direction (a direction perpendicular to the sheet surface) orthogonal of the x and y directions as a z direction (optical axis direction). FIG. 2 shows the pixel (imaging pixel) array of the image sensor 107 (two-dimensional CMOS sensor) in the range of 4 columns×4 rows, and the sub-pixel array in the range of 8 columns×4 rows.

In this embodiment, in a pixel group 200 of 2 columns×2 rows shown in FIG. 2, a pixel 200R having a spectral sensitivity of R (red) is arranged at the upper left position, pixels 200E having a spectral sensitivity of G (green) are arranged at the upper right and lower left positions, and a pixel 200B having a spectral sensitivity of B (blue) is arranged at the lower right position. Each pixel is divided into $N_x$ ($N_x$ is a natural number) parts in the x direction and $N_y$ ($N_y$ is a natural number) parts in the y direction, and constituted by $N_x \times N_y$ sub-pixels=number $N_{LF}$ of pupil divisions. Note that in the example shown in FIG. 2, $N_x$=2, $N_y$=1, and $N_{LF}$=2×1=2. Each pixel is formed from a first sub-pixel 201 and a second sub-pixel 202. In the following explanation, each pixel is assumed to be divided into two parts in the x direction but not divided in the y direction, as shown in FIG. 2, for the sake of simplicity. However, pixel division of this embodiment is not limited to that shown in FIG. 2. A method of generalizing the following description for a case in which $N_x \geq 2$, and $N_y \geq 2$ will be explained in the third embodiment.

In the example shown in FIG. 2, a number of sets of pixels of 4 columns×4 rows (sub-pixels of 8 columns×4 rows) are arranged on a plane, thereby acquiring an input image used to generate a captured image and two viewpoint images (the number of viewpoint images corresponds to the number of pupil divisions of 2). In the image sensor 107, a period P of the pixels is 6 μm (micrometers), the number $N_H$ of horizontal (column direction) pixels=6000 columns, the number $N_V$ of vertical (row direction) pixels=4000 rows, and the number N of pixels=$N_H \times N_V$=24,000,000 pixels. In addition, a column direction period $P_s$ of the sub-pixels is 3 μm, and the number $N_s$ of sub-pixels is 12,000 columns in the horizontal direction×4000 rows in the vertical direction=48,000,000 pixels.

Figure 3A:
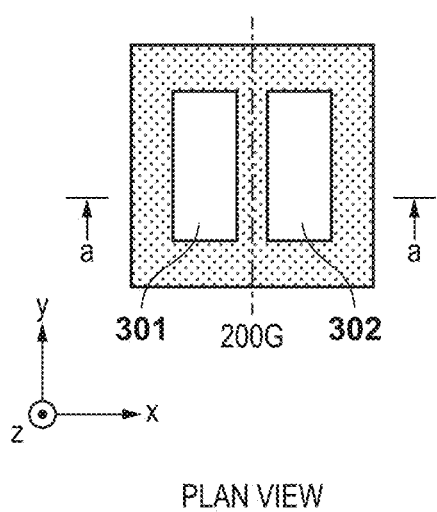
FIG. 3A is a plan view of a pixel of the image sensor 107 according to the first embodiment.
Figure 3B:
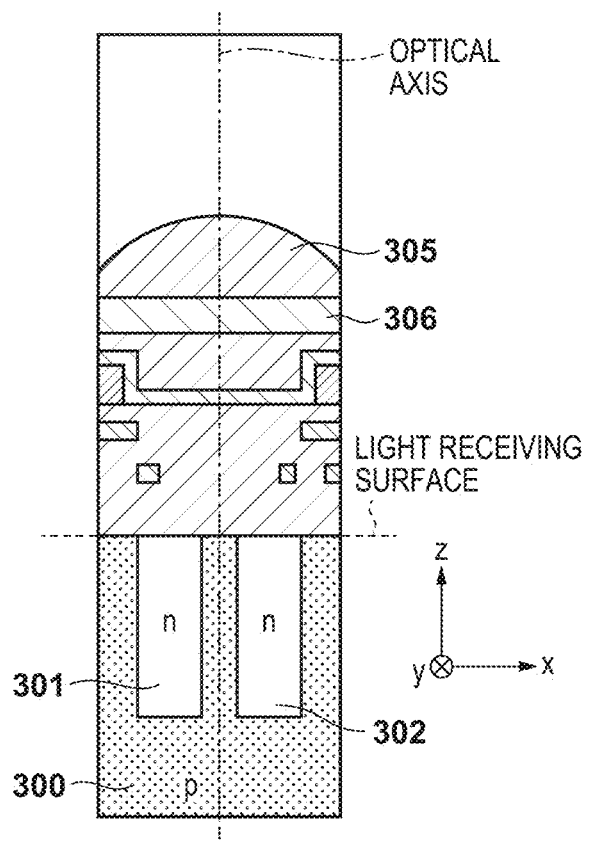
FIG. 3B is a sectional view of a pixel of the image sensor 107 according to the first embodiment.

FIG. 3A is a plan view in a case in which one pixel 200G of the image sensor 107 shown in FIG. 2 is viewed from the light receiving surface side (+z side) of the image sensor 107. A z-axis is set in a direction perpendicular to the sheet surface of FIG. 3A, and the near side is defined as the positive direction of the z-axis. A y-axis is set in the top-and-bottom direction orthogonal to the z-axis, and the upper side is defined as the positive direction of the y-axis. An x-axis is set in the left-and-right direction orthogonal to the z- and y-axes, and the right side is defined as the positive direction of the x-axis. FIG. 3B is a sectional view taken along a cutting line a-a in FIG. 3A and viewed from the −y side.

As shown in FIGS. 3A and 3B, is the pixel 200G, a microlens 305 configured to condense incident light to the light receiving surface side (+z direction) of each pixel is formed. In addition, the pixel is divided into two units in the x direction and divided into one unit (not divided) in the y direction to form two photoelectric conversion units (a first photoelectric conversion unit 301 and a second photoelectric conversion unit 302). The first photoelectric conversion unit 301 and the second photoelectric conversion unit 302 correspond to the first sub-pixel 201 and the second sub-pixel 202, respectively.

The first photoelectric conversion unit 301 and the second photoelectric conversion unit 302 are two independent p-n junction photodiodes which are formed by a p-type well layer 300 and the two divided n-type layers 301 and 302. An intrinsic layer may be sandwiched as needed to form a photoelectric conversion unit as a pin structure photodiode. In each pixel, a color filter 306 is formed between the microlens 305 and the first photoelectric conversion unit 301 and the second photoelectric conversion unit 302. The spectral transmittance of the color filter 306 may be changed as needed on a pixel basis or photoelectric conversion unit basis. Alternatively, the color filter may be omitted.

Light that has entered the pixel 200G is condensed by the microlens 305, separated into spectral components by the color filter 306, and received by the first photoelectric conversion unit 301 and the second photoelectric conversion unit 302. In the first photoelectric conversion unit 301 and the second photoelectric conversion unit 302, electrons and holes are generated in par in accordance with the light receiving amount and separated by a depletion layer. After that, the electrons are accumulated. On the other hand, the holes are discharged to the outside of the image sensor 107 via a p-type well layer connected to a constant voltage source (not shown). The electrons accumulated in each of the first photoelectric conversion unit 301 and the second photoelectric conversion unit 302 are transferred to an electrostatic capacitance portion (FD) via a transfer gate, and converted into a voltage signal.

Figure 4:
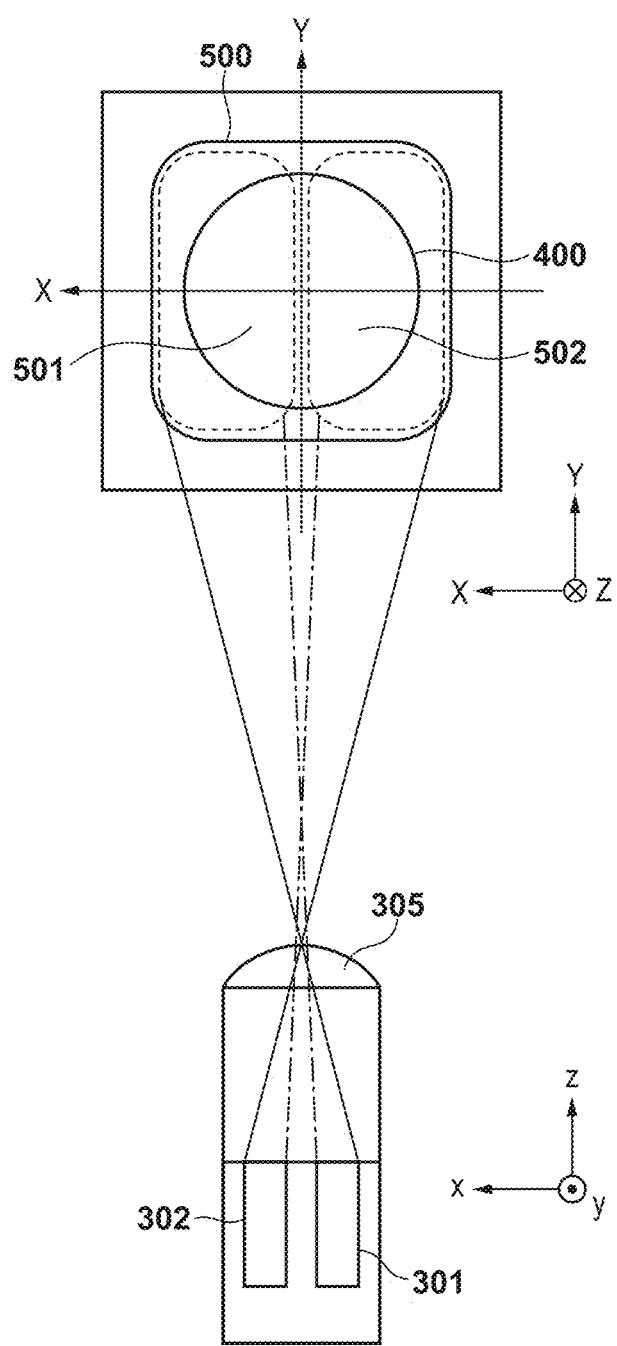
FIG. 4 is a schematic explanatory view showing the correspondence relationship between pupil division and the pixel structure of the image sensor 107 according to the first embodiment.

FIG. 4 is a schematic explanatory view showing the correspondence relationship between pupil division and the pixel structure of the image sensor 107. FIG. 4 shows a sectional view showing the section of the pixel structure taken along the line a-a in FIG. 3A, which is viewed from the +y direction, and a view of the exit pupil plane of the imaging optical system viewed from the −z direction. In FIG. 4, to attain a correspondence with the coordinate axes of the exit pupil plane, the x- and y-axes of the sectional view are reversed from the state shown in FIGS. 3A and 3B.

The image sensor 107 is arranged near the imaging plane of the imaging lens (imaging optical system). A light beam from an object passes through an exit pupil 400 of the imaging optical system and enters each pixel. The plane on which the image sensor 107 is arranged is defined as the imaging plane.

A first partial pupil region 501 and a second partial pupil region 502, which are 2×1-divided, have an almost optically conjugate relationship with the light receiving surfaces of the first photoelectric conversion unit 301 and the second photoelectric conversion unit 302 via the microlens. The first partial pupil region 501 and the second partial pupil region 502 are pupil regions capable of receiving light by the first sub-pixel 201 and the second sub-pixel 202, respectively. The first partial pupil region 501 of the first sub-pixel 201 has a center of gravity decentered to the +X side on the pupil plane, and the second partial pupil region 502 of the second sub-pixel 202 has a center of gravity decentered to the −X side on the pupil plane.

A pupil region 500 has an almost optically conjugate relationship with the light receiving surface including both the first photoelectric conversion unit 301 and the second photoelectric conversion unit 302, which are 2×1-divided, via the microlens. The pupil region 500 is a pupil region capable of receiving light by the entire pixel 200G including both the first sub-pixel 201 and the second sub-pixel 202.

FIGS. 5A and 5B show light intensity distributions formed when light enters the microlens formed on each pixel. FIG. 5A is a view showing a light intensity distribution on a section parallel to the optical axis of the microlens. FIG. 5B is a view showing a light intensity distribution on a section perpendicular to the optical axis of the microlens. Referring to FIG. 5A, H represents the convex-side surface of the microlens 305; and f, the focal length of the microlens. In addition, nFΔ represents the movable range of a focus position by refocus (to be described later); and φ, the maximum angle of an incident light beam. The incident light is condensed to the focus position by the microlens. However, the diameter of the focusing spot cannot be smaller than a diffraction limit Δ and is finite because of the influence of diffraction caused by the wave characteristic of light. The size of the light receiving surface of the photoelectric conversion unit is about 1 to 2 μm. On the other hand, the size of the focusing spot of the microlens is about 1 μm. For this reason, the pupil region is conjugate with the light receiving surfaces of the photoelectric conversion units. The first partial pupil region 501 and the second partial pupil region 502 shown in FIG. 4 are not clearly divided because of a diffraction blur, and a light reception ratio distribution (pupil intensity distribution) depending on the incident angle of light is formed.

Figure 6:
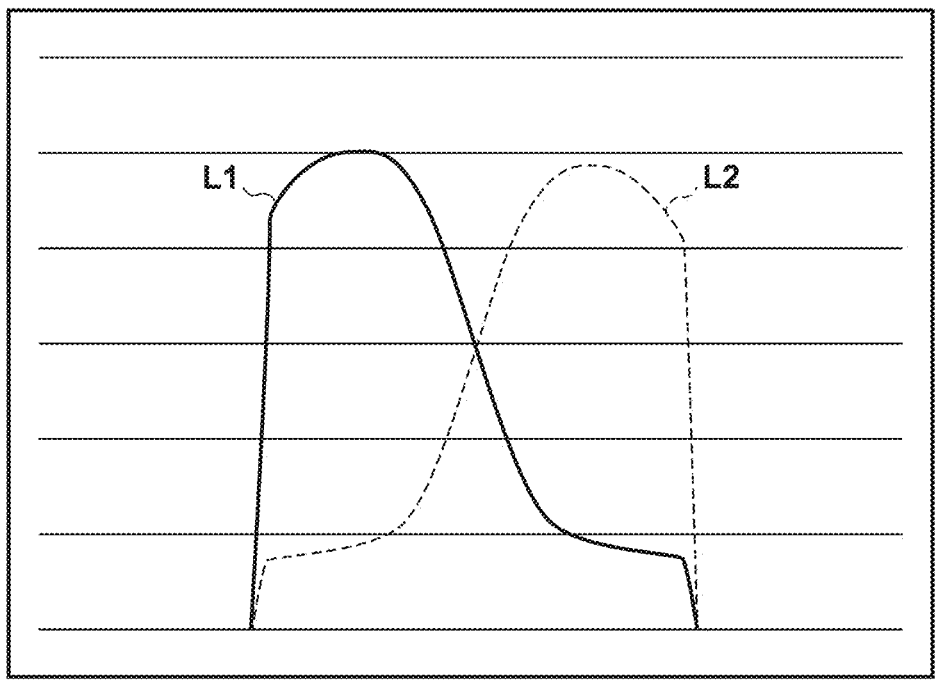
FIG. 6 is a view showing a light reception ratio distribution (pupil intensity distribution) depending on the incident angle of light.

FIG. 6 shows an example of the light reception ratio distribution (pupil intensity distribution) depending on the incident angle of light. In FIG. 6, the abscissa represents the pupil coordinate, and the ordinate represents the light reception ratio. A graph L1 indicated by a solid line in FIG. 6 represents a pupil intensity distribution on the first partial pupil region 501 shown in FIG. 4 along the x-axis. The light reception ratio represented by the graph L1 steeply rises from the left end, reaches the peak, gradually lowers, and reaches the right end at a moderate change ratio. A graph L2 indicated by a broken line in FIG. 6 represents a pupil intensity distribution on the second partial pupil region 502 along the x-axis. To the contrary to the graph L1, the light reception ratio represented by the graph L2 steeply rises from the right end, reaches the peak, gradually lowers, and reaches the left end at a moderate change ratio. Pupil division is moderately done, as can be seen from FIG. 6.

Figure 7:
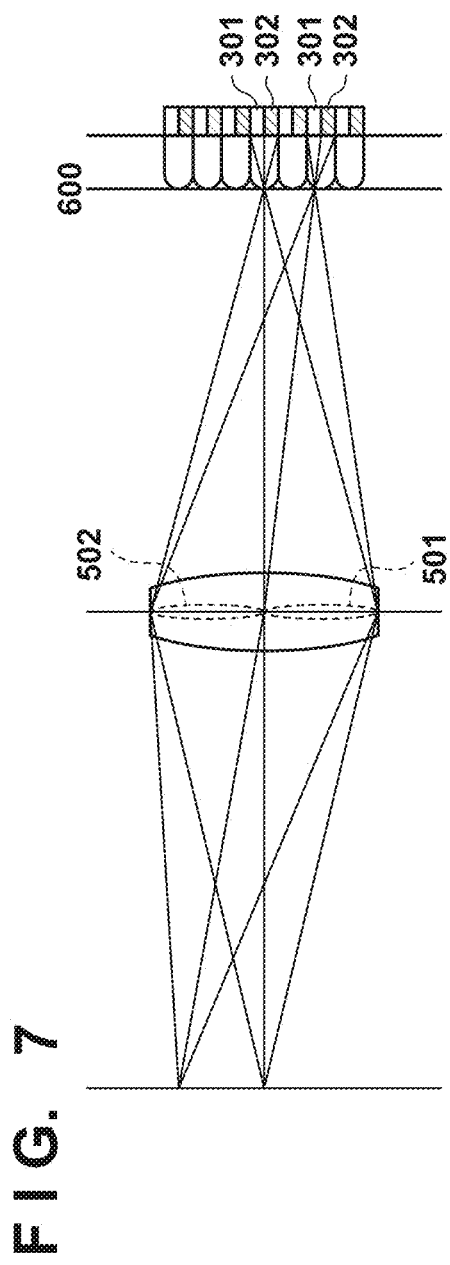
FIG. 7 is a view showing the correspondence relationship between the image sensor 107 and pupil division.

FIG. 7 is a view showing the correspondence relationship between the image sensor 107 and pupil division. The first photoelectric conversion unit 301 and the second photoelectric conversion unit 302 correspond to the first sub-pixel 201 and the second sub-pixel 202, respectively. In each pixel of the image sensor 107, the first sub-pixel 201 and the second sub-pixel 202 which are 2×1-divided respectively receive light beams that have passed through different partial pupil regions, that is, the first partial pupil region 501 and the second partial pupil region 502 of the imaging optical system. LF data (input image) representing the spatial distribution and angular distribution of light intensities is acquired from the signal of light received by each sub-pixel.

When the signals of the first sub-pixels 201 and the second sub-pixels 202 are composited based on the LF data, a captured image having a resolution corresponding to the number N of pixels can be generated. In addition, when the signal of a specific sub-pixel selected from the first sub-pixel 201 and the second sub-pixel 202 is acquired from LF data for each pixel, a viewpoint image corresponding to a specific partial pupil region of the first partial pupil region 501 and the second partial pupil region 502 can be generated. For example, when the signal of the first sub-pixel 201 is acquired from LF data for each pixel, a viewpoint image (first viewpoint image) corresponding to the first partial pupil region 501 and having a resolution corresponding to the number N of pixels can be generated. This also applies to other sub-pixels.

As described above, the image sensor 107 has a structure in which a plurality of pixels each provided with a plurality of photoelectric conversion units configured to receive light beams passing through different partial pupil regions of the imaging optical system are arrayed, and can acquire IF data (input image).

Relationship between Defocus Amount and Image Shift Amount

The relationship between an image shift amount and the defocus amount of the first viewpoint image and the second viewpoint image generated from IF data (input image) acquired by the image sensor 107 will be described below.

Figure 8:
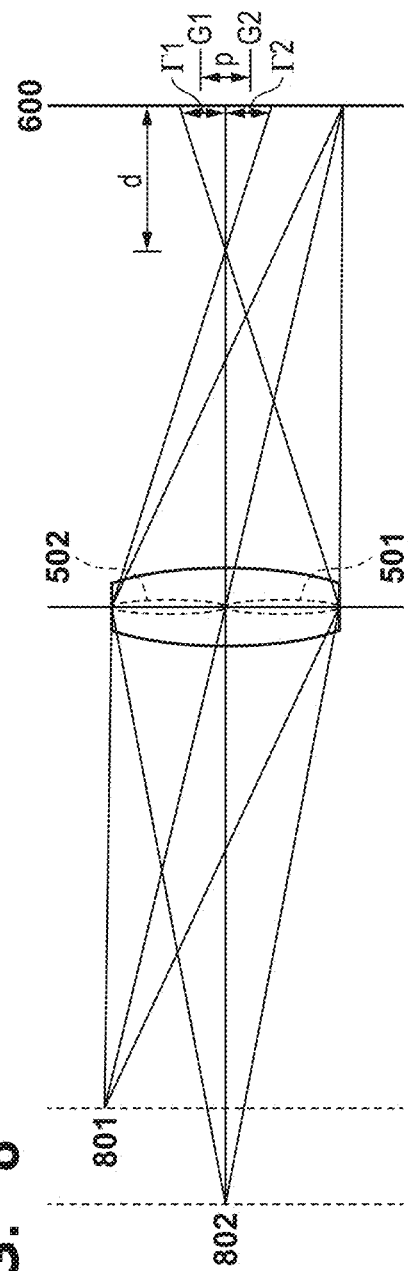
FIG. 8 is a view schematically showing the relationship between the defocus amount of a first viewpoint image and a second viewpoint image and the image shift amount between the first viewpoint image and the second viewpoint image.

FIG. 8 is a view schematically showing the relationship between the defocus amount of a first viewpoint image and a second viewpoint image and the image shift amount between the first viewpoint image and the second viewpoint image. The image sensor 107 (not illustrated in FIG. 8) is arranged on an imaging plane 600. The exit pupil 400 of the imaging optical system is 2×1-divided into the first partial pupil region 501 and the second partial pupil region 502, as in FIGS. 4 and 7.

As for a defocus amount d, the magnitude |d| represents the distance from the imaging position of the object image to the imaging plane 600. The direction of the defocus amount d is defined such that the defocus amount d has a minus sign (d<0) in a front focus state in which the imaging position of the object image is located on the object side of the imaging plane 600, and has a plus sign (d>0) in a rear focus state reverse to the front focus state. In an in-focus state in which the imaging position of the object image is located on the imaging plane 600, d=0. The position of an object 801 shown in FIG. 8 represents a position p corresponding to the in-focus state (d=0), and the position of an object 802 represents a position p corresponding to the front focus state (d<0). Both the front focus state (d<0) and the rear focus state (d>0) will be referred to as a defocus state (|d|>0) hereinafter.

In the front focus state (d<0), of the light components for the object 802, a light beam that has passed through the first partial pupil region 501 (or the second partial pupil region 502) temporarily condenses and then spreads to a width Γ1 (or Γ2) with respect to a position G1 (or G2) of center of gravity of the light beam as the center. In this case, a blurred image is formed on the imaging plane 600. The blurred image is received by the first sub-pixel 201 (or the second sub-pixel 202) that forms each of the pixels arrayed on the image sensor 107, and a first viewpoint image (or a second viewpoint image) is generated. Hence, the first viewpoint image (or the second viewpoint image) is stored in a memory as the image data of the object image (blurred image) having the width Γ1 (or Γ2) at the position G1 (or G2) of center of gravity on the imaging plane 600. As the magnitude |d| of the defocus amount d increases, the width Γ1 (or Γ2) of the object image increases almost proportionally. Similarly, let p be the image shift amount of the object image between the first viewpoint image and the second viewpoint image. The magnitude |p| of the image shift amount p increases along with an increase in the magnitude |d| of the defocus amount d. For example, the image shift amount p is defined as the difference "G1-G2" of the positions of center of gravity of light beams, and the magnitude |p| increases almost proportionally as |d| increases. Note that is the rear focus state (d>0), the image shift direction of the object image between the first viewpoint image and the second viewpoint image is reverse to that in the front focus state, but a similar tendency is exhibited.

Hence, according to this embodiment, as the defocus amount of the first viewpoint image and second viewpoint image or the captured image obtained by adding the first viewpoint image and the second viewpoint image increases/decreases, the magnitude of the image shift amount between the first viewpoint image and the second viewpoint image increases/decreases.

Correction Processing of Viewpoint Image Based on Captured image (Outline)

Figure 9:
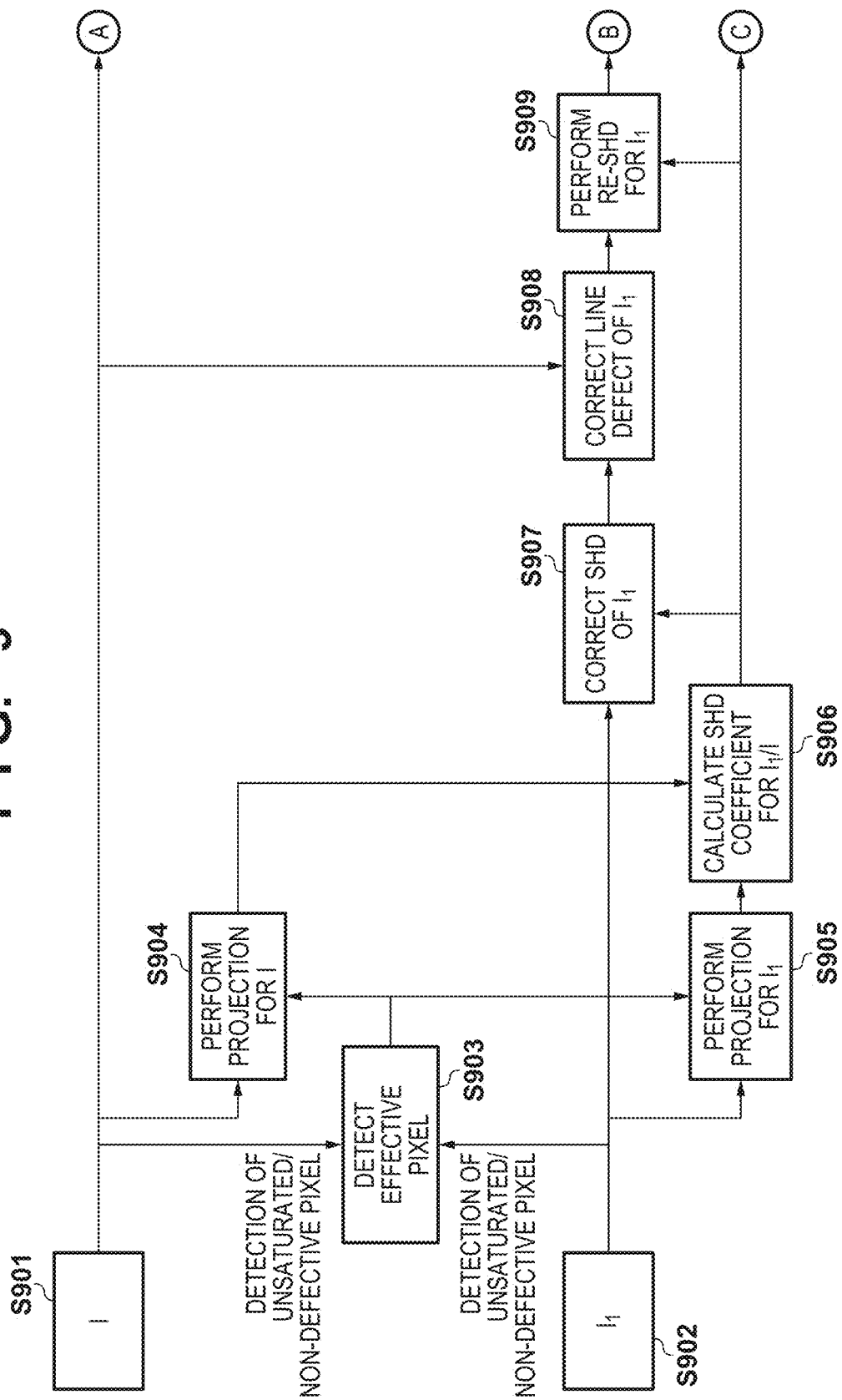
FIG. 9 is a flowchart of correction processing for a viewpoint image based on a captured image.
Figure 10:
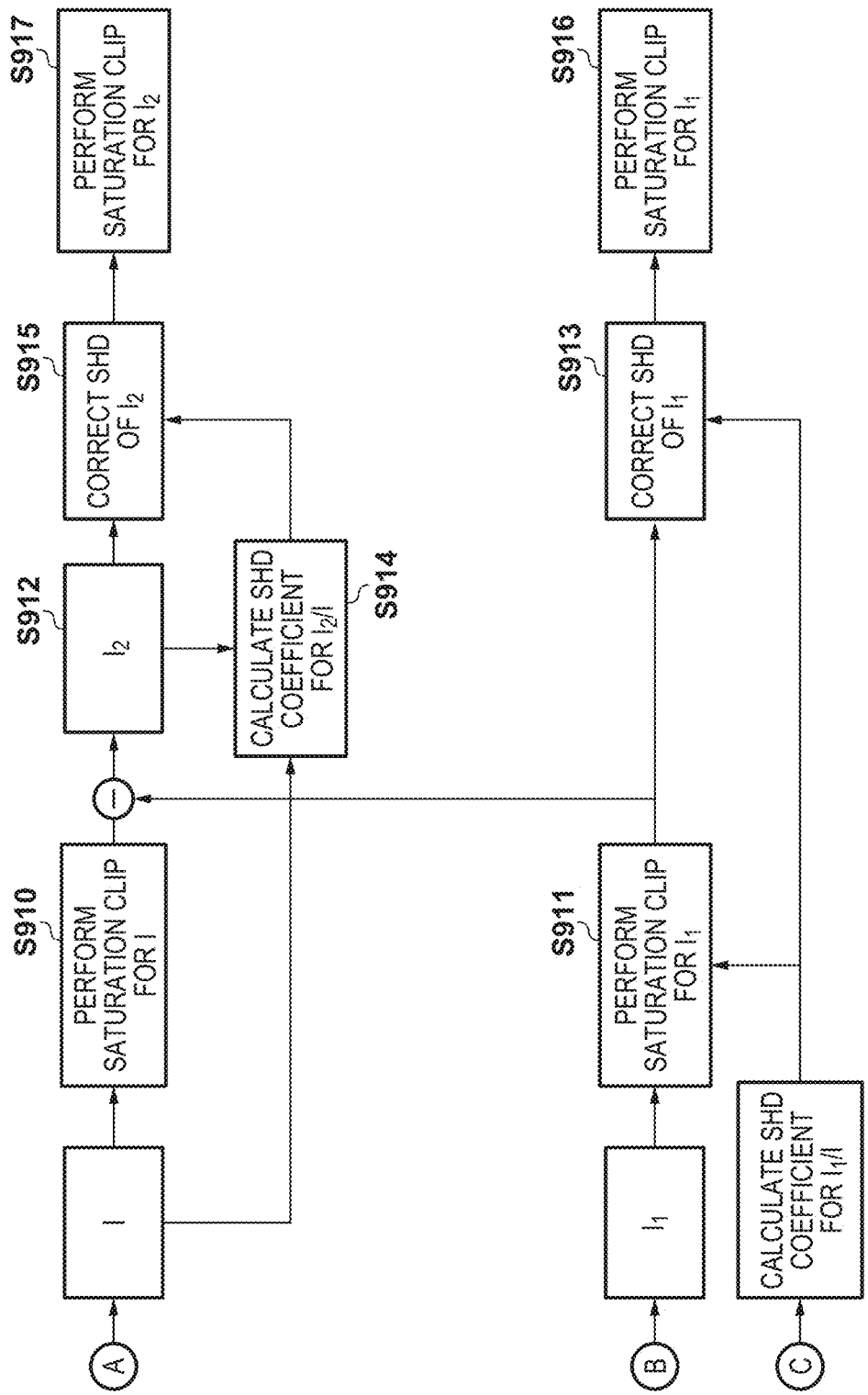
FIG. 10 is a flowchart of correction processing for a viewpoint image based on a captured image (continued from FIG. 9)

The image capturing apparatus 100 according to this embodiment performs correction processing such as flaw correction or shading correction based on the captured image for the first viewpoint image and the second viewpoint image, thereby generating an output image. An image processing method of performing correction processing for the first viewpoint image and the second viewpoint image based on the captured image to generate an output image from LF data (input image) acquired by the image sensor 107 will be described below with reference to FIGS. 9 and 10. Note that the processes of steps shown in FIGS. 9 and 10 are implemented when the CPU 121 controls the units of the image capturing apparatus 100 in accordance with a control program, unless specifically stated otherwise.

Acquisition of Captured Image and Viewpoint Images (S901 and S902)

First, the image capturing apparatus 100 generates a captured image corresponding to a pupil region formed by compositing different partial pupil regions of the imaging optical system and a first viewpoint image corresponding to the first partial pupil region 501 from LF data acquired by the image sensor 107.

In step S901, the image capturing apparatus 100 acquires a captured image. More specifically, the image capturing apparatus 100 performs image capturing using the image sensor 107, thereby acquiring LF data. Alternatively, the image capturing apparatus 100 may acquire LF data saved in the flash memory 133 in advance. The image capturing apparatus 100 generates a captured image corresponding to a pupil region formed by compositing different partial pupil regions (the first partial pupil region and the second partial pupil region) of the imaging optical system. The IF data will be referred to as LF here. A sub-pixel signal that is the $i_s$th ($1 \leq i_s \leq N_x$) in the column direction and the $j_s$th ($1 \leq j_s \leq N_y$) in the row direction in each pixel signal of LF will be referred to as a kth sub-pixel signal. Here, $k=N_x(j_s-1)+i_s(1 \leq k \leq N_{LF})$. The image capturing apparatus 100 generates a captured image I(j,i) corresponding to the pupil region formed by compositing different partial pupil regions of the imaging optical system, which is the ith in the column direction and the jth in the row direction, by $$I(j, i) = \sum_{j_S=1}^{N_y} \sum_{i_S=1}^{N_x} LF(N_y(j-1) + j_S, N_x(i-1) + i_S) \quad (1)$$

In this embodiment, to satisfactorily hold the S/N of the captured image I(j,i), the image capturing apparatus 100 composites the sub-pixel signals of equation (1) in the electrostatic capacitance portion (FD) of the image sensor 107 before the sub-pixel signals are A/D-converted. The image capturing apparatus 100 may composite the sub-pixel signals of equation (1), as needed, when converting charges accumulated in the electrostatic capacitance portion (FD) of the image sensor 107 into a voltage signal before the A/D conversion of the sub-pixel signals. Alternatively, the image capturing apparatus 100 may composite the sub-pixel signals of equation (1), as needed, after the sub-pixel signals are A/D-converted.

Note that in the following explanation, if the pixel position need not strictly be taken into consideration, the captured image I(j,i) will sometimes be referred to simply as "captured image I" by omitting "(j,i)". This also applies to "kth viewpoint image $I_k(j,i)$" and the like to be described later.

As described above, in this embodiment, an explanation will be made using an example of 2-way division in the x direction in which $N_x=2$, $N_y=1$, and $N_{LF}=2$. The image capturing apparatus 100 composites the signals of the first sub-pixel 201 and the second sub-pixel 202 on a pixel basis from the IF data corresponding to the pixel array shown in FIG. 2, and generates a captured image formed from RGB signals of a Bayer arrangement with a resolution corresponding to the number N of pixels number (=$N_H$ of horizontal pixels×number $N_V$ of vertical pixels).

In this embodiment, to use the captured image as a reference image of correction criterion in correction processing of the viewpoint image, the image capturing apparatus 100 performs shading (light amount) correction, point flaw correction processing, and the like of the captured image I(j,i) for each of the RGB components. The image capturing apparatus 100 may perform another processing as needed.

Next, in step S902, the image capturing apparatus 100 generates the kth viewpoint image $I_k$(j,i) corresponding to the kth partial pupil region of the imaging optical system, which is the ith in the column direction and the ith in the row direction, by $$I_k(j,i)=I_{N_{LF}(j_S-1)+i_S}(j,i)=LF(N_y(j-1)+j_s, N_x(i-1)+i_s) \quad (2)$$

As described above, in this embodiment, an explanation will be made using an example of 2-way division in the x direction in which $N_x$=2, N=1, and $N_{LF}$=2. Also assume that k=1. The image capturing apparatus 100 acquires the signal of the first sub-pixel 201 on a pixel basis from the IF data corresponding to the pixel array shown in FIG. 2. That is, the image capturing apparatus 100 generates a first viewpoint image $I_1$(j,i) corresponding to the first partial pupil region 501 of the imaging optical system and formed from RGB signals of a Bayer arrangement with a resolution corresponding to the number N of pixels (=number $N_H$ of horizontal pixels×number $N_v$ of vertical pixels). The image capturing apparatus 100 may select k=2 and generate a second viewpoint image $I_2$(j,i) corresponding to the second partial pupil region 502 of the imaging optical system, as needed.

As described above, the image capturing apparatus 100 generates, from the LF data acquired by the image sensor 107, the captured image I(j,i) formed from RGB signals of a Bayer arrangement and the first viewpoint image $I_1$(j,i) formed from RGB signals of a Bayer arrangement, and saves them in the flash memory 133. In this embodiment, the image capturing apparatus 100 generates the second viewpoint image $I_2$(j,i) from the captured image I(j,i) and the first viewpoint image $I_1$(j,i). This makes it possible to perform, for the captured image I(j,i), the same image processing as that for a captured image acquired by the conventional image sensor 107 in which the photoelectric conversion unit of each pixel is not divided. However, to perform the same processing for the viewpoint images, as needed, the image capturing apparatus 100 may generate the first viewpoint image $I_1$(j,i) and the second viewpoint image $I_2$(j,i) from the IF data and save them in the flash memory 133.

Shading Correction Processing of Viewpoint Image (S903 to S907)

Subsequently, the image capturing apparatus 100 performs shading (light amount) correction of the first viewpoint image $I_1$(j,i) for each of the RCP, components based on the captured image I(j,i). Shading caused by a pupil shift between the first viewpoint image and the second viewpoint image will be described here. FIGS. 11A to 11C show the relationship between the first partial pupil region 501 where the first photoelectric conversion unit 301 receives light, the second partial pupil region 502 where the second photoelectric conversion unit 302 receives light, and the exit pupil 400 of the imaging optical system at the peripheral image height of the image sensor 107. The same reference numerals as in FIG. 4 denote the same or similar elements in FIGS. 11A to 11C. The first photoelectric conversion unit 301 and the second photoelectric conversion unit 302 correspond to the first sub-pixel 201 and the second sub-pixel 202, respectively.

FIG. 11A shows a case in which an exit pupil distance D1 of the imaging optical system equals a set pupil distance Ds of the image sensor 107. In this case, the exit pupil 400 of the imaging optical system is almost evenly divided by the first partial pupil region 501 and the second partial pupil region 502. FIG. 11B shows a case in which the exit pupil distance D1 of the imaging optical system is shorter than the set pupil distance Ds of the image sensor 107. In this case, a pupil shift occurs between the exit pupil 400 of the imaging optical system and the entrance pupil of the image sensor 107 at the peripheral image height of the image sensor 107, and the exit pupil 400 of the imaging optical system is unevenly divided. FIG. 11C shows a case in which the exit pupil distance D1 of the imaging optical system is longer than the set pupil distance Ds of the image sensor 107. In this case as well, a pupil shift occurs between the exit pupil 400 of the imaging optical system and the entrance pupil of the image sensor 107 at the peripheral image height of the image sensor 107, and the exit pupil 400 of the imaging optical system is unevenly divided. If the pupil division at the peripheral image height is uneven, the intensities of the first viewpoint image and the second viewpoint image are also uneven. Shading occurs for each of the RGB components, in which one of the first viewpoint image and the second viewpoint image has a higher intensity, and the other has a lower intensity.

In this embodiment, to generate a viewpoint image of high quality, the image capturing apparatus 100 performs shading (light amount) correction of the first viewpoint image $I_1$ for each of the RGB components using the captured image I(j,i) as a reference image of criterion.

In step S903, the image capturing apparatus 100 detects an effective pixel $V_1$(j,i) that is unsaturated and non-defective (non-flaw) in both the captured image I(j,i) and the first viewpoint image $I_1$(j,i). An effective pixel that is unsaturated and non-defective in both the captured image I(j,i) and the first viewpoint image $I_1$(j,i) is defined as $V_1$(j,i)=1. On the other hand, a non-effective pixel that is unsaturated or non-defective in at least one of the captured image I(j,i) and the first viewpoint image $I_1$(j,i) is defined as $V_1$(j,i)=0. In shading (light amount) correction of the kth viewpoint image $I_k$, similarly, an effective pixel that is unsaturated and non-defective in both the captured image I(j,i) and the kth viewpoint image $I_k$(j,i) is defined as $V_k$(j,i)=1.

Saturation determination will be described in detail. Let IS be the saturation determination threshold of an imaging signal. If the captured image I(j,i)>IS, the image capturing apparatus 100 determines the captured image I(j,i) as saturated. If the captured image I(j,i)≤IS, the image capturing apparatus 100 determines the captured image I(j,i) as unsaturated. Similarly, let $IS_k$ be the saturation determination threshold of the kth viewpoint image. If the kth viewpoint image $I_k$(j,i)>$IS_k$, the image capturing apparatus 100 determines the kth viewpoint image $I_k$(j,i) as saturated. If the kth viewpoint image $I_k$(j,i)≤IS, the image capturing apparatus 100 determines the kth viewpoint image $I_1$(j,i) as unsaturated. The saturation determination threshold $IS_k$ of the kth viewpoint image is equal to or smaller than the saturation determination threshold IS ($IS_k$≤IS) of the imaging signal.

Note that the definition of an effective pixel is not limited to "unsaturated and non-defective". The image capturing apparatus 100 determines a pixel having an effective value in both the captured image and the viewpoint image as an effective pixel based on a certain criterion. As the criterion to determine whether a pixel has an effective value, for example, at least one of whether the pixel is a saturated pixel and whether the pixel is a defective pixel can be used.

The image sensor 107 according to this embodiment is configured such that if charges accumulated in one of the first photoelectric conversion unit 301 and the second photoelectric conversion unit 302 of each pixel are saturated, the charges leak not to the outside of the pixel but to the other photoelectric conversion unit (sub-pixel) of the same pixel. This phenomenon is called charge crosstalk. Consider a case in which one (for example, the second sub-pixel) of the sub-pixels is saturated, and charge crosstalk occurs between the sub-pixels (for example, from the second sub-pixel to the first sub-pixel). In this case, the linear relationship of the accumulated charge amount to the incident light amount is kept neither in the sub-pixel (for example, the second sub-pixel) of the charge overflow source nor in the sub-pixel (for example, the first sub-pixel) of the charge leak destination, and information necessary to correctly detect shading cannot be included.

In low ISO, the amount of charges accumulated in the photoelectric conversion units is relatively large, and charge crosstalk relatively easily occurs, as compared to high ISO. Hence, in this embodiment, the saturation determination threshold IS of the imaging signal in low ISO is preferably smaller than the saturation determination threshold IS of the imaging signal in high ISO. In addition, the saturation determination threshold $IS_k$ of the kth viewpoint image in low ISO) is preferably smaller than the saturation determination threshold $IS_k$ of the kth viewpoint image in high ISO.

Also consider a case in which the exit pupil distance of the imaging optical system is shorter than a first predetermined pupil distance (or longer than a second predetermined pupil distance), and shading is caused by the pupil shift between the exit pupil 400 of the imaging optical system and the entrance pupil of the image sensor 107. In this case, at the peripheral image height, one of the first viewpoint image and the second viewpoint image has a higher intensity while the other has a lower intensity, and charge crosstalk readily occurs. Hence, to improve saturated pixel detection accuracy, the saturation determination threshold IS in a case in which the exit pupil distance is shorter than the first predetermined pupil distance (or longer than the second predetermined pupil distance) is preferably smaller than the saturation determination threshold IS in a case in which the exit pupil distance falls within the range from the first predetermined pupil distance to the second predetermined pupil distance (inclusive). In addition, the saturation determination threshold $IS_k$ of the kth viewpoint image in a case in which the exit pupil distance is shorter than the first predetermined pupil distance (or longer than the second predetermined pupil distance) is preferably smaller than the saturation determination threshold $IS_k$ in a case in which the exit pupil distance falls within the range from the first predetermined pupil distance (inclusive) to the second predetermined pupil distance (inclusive).

Next, in steps S904 and S905, the image capturing apparatus 100 performs projection processing for the captured image and the first viewpoint image on a color basis. Here, an integer $j_2(1 \le j_2 \le N_V/2)$ and $i_2(1 \le i_2 \le N_H/2)$ are set. Let $RI(2j_2-1, 2i_2-1)=I(2j_2-1, 2i_2-1)$ be the R component of the captured image I corresponding to the Bayer arrangement shown in FIG. 2, and $GrI(2j_2-1, 2i_2)=I(2j_2-1, 2i_2)$ be the Gr component. Additionally, let $GbI(2j_2, 2i_2-1)=I(2j_2, 2i_2-1)$ be the Gb component, and $BI(2j_2, 2i_2)=I(2j_2, 2i_2)$ be the B component.

Similarly, let $RI_k(2j_2-1, 2i_2-1)=I_k(2j_2-1, 2i_2-1)$ be the R component of the kth viewpoint image $I_k$ corresponding to the Bayer arrangement shown in FIG. 2, and $GrI_k(2j_2-1, 2i_2)=I_k(2j_2-1, 2i_2)$ be the Gr component. Additionally, let $GbI_k(2j_2, 2i_2-1)=I_k(2j_2, 2i_2-1)$ be the Gb component, and $Bi_k(2j_2, 2i_2)=I_k(2j_2, 2i_2)$ be the B component.

In step S904, the image capturing apparatus 100 performs projection processing for $RI(2j_2-1, 2i_2-1)$, $GrI(2j_2-1, 2i_2)$, $GbI(2j_2, 2i_2-1)$, and $BI(2j_2, 2i_2)$ of the captured image. The image capturing apparatus 100 performs projection processing in a direction (y direction) orthogonal to the pupil division direction (x direction) in accordance with $$RP(2i_2 - 1) = \begin{cases} \dfrac{\sum_{j_2=1}^{N_V/2} RI(2j_2-1, 2i_2-1) \times V_k(2j_2-1, 2i_2-1)}{\sum_{j_2=1}^{N_V/2} V_k(2j_2-1, 2i_2-1)}, & \sum_{j_2=1}^{N_V/2} V_k(2j_2-1, 2i_2-1) \ne 0 \\ 0, & \sum_{j_2=1}^{N_V/2} V_k(2j_2-1, 2i_2-1) = 0 \end{cases} \quad (3A)$$

$$G_r P(2i_2) = \begin{cases} \dfrac{\sum_{j_2=1}^{N_V/2} G_r I(2j_2-1, 2i_2) \times V_k(2j_2-1, 2i_2)}{\sum_{j_2=1}^{N_V/2} V_k(2j_2-1, 2i_2)}, & \sum_{j_2=1}^{N_V/2} V_k(2j_2-1, 2i_2-1) \ne 0 \\ 0, & \sum_{j_2=1}^{N_V/2} V_k(2j_2-1, 2i_2-1) = 0 \end{cases} \quad (3B)$$

$$G_b P(2i_2 - 1) = \begin{cases} \dfrac{\sum_{j_2=1}^{N_V/2} G_b I(2j_2, 2i_2 - 1) \times V_k(2j_2, 2i_2 - 1)}{\sum_{j_2=1}^{N_V/2} V_k(2j_2, 2i_2 - 1)}, & \sum_{j_2=1}^{N_V/2} V_k(2j_2, 2i_2 - 1) \neq 0 \\ 0, & \sum_{j_2=1}^{N_V/2} V_k(2j_2, 2i_2 - 1) = 0 \end{cases} \quad (3C)$$

$$BP(2i_2) = \begin{cases} \dfrac{\sum_{j_2=1}^{N_V/2} BI(2j_2, 2i_2) \times V_k(2j_2, 2i_2)}{\sum_{j_2=1}^{N_V/2} V_k(2j_2, 2i_2)}, & \sum_{j_2=1}^{N_V/2} V_k(2j_2, 2i_2) \neq 0 \\ 0, & \sum_{j_2=1}^{N_V/2} V_k(2j_2, 2i_2) = 0 \end{cases} \quad (3D)$$

As a result, projection signals $RP(2i_2-1)$, $GrP(2i_2)$, $GbP(2i_2-1)$, and $BP(2i_2)$ of the captured image are generated. A saturated signal value or defective signal value does not include information necessary to correctly detect shading of the captured image for each of the RGB components. For this reason, in the projection processing, the product of the captured image and the effective pixel is calculated, thereby excluding a saturated signal value or defective signal value (numerators on the upper side of equations (3A) to (3D)). Then, normalization is performed by the number of effective pixels used in the projection processing (denominators on the upper side of equations (3A) to (3D)). If the number of effective pixels used in the projection processing is 0, the projection signal of the captured image is set to 0 based on the lower side of equations (3A) to (3D). In addition, if the projection signal of the captured image is a negative signal because of the influence of noise or the like, the projection signal of the captured image is set to 0.

Similarly, in step S905, the image capturing apparatus 100 performs projection processing for $RI_k(2i_2-1,2i_2-1)$, $GrI_k(2j_2-1,2i_2)$, $GbI_k(2j_2,2i_2-1)$, and $BI_k(2j_2,2i_2)$ of the kth viewpoint image. The image capturing apparatus 100 performs projection processing in a direction (y direction) orthogonal to the pupil division direction (a direction) in accordance with $$RP_k(2i_2 - 1) = \quad (3E)$$

$$\begin{cases} \dfrac{\sum_{j_2=1}^{N_V/2} RI_k(2j_2 - 1, 2i_2 - 1) \times V_k(2j_2 - 1, 2i_2 - 1)}{\sum_{j_2=1}^{N_V/2} V_k(2j_2 - 1, 2i_2 - 1)}, & \sum_{j_2=1}^{N_V/2} V_k(2j_2 - 1, 2i_2 - 1) \neq 0 \\ 0, & \sum_{j_2=1}^{N_V/2} V_k(2j_2 - 1, 2i_2 - 1) = 0 \end{cases}$$

$$G_r P_k(2i_2) = \begin{cases} \dfrac{\sum_{j_2=1}^{N_V/2} G_r I_k(2j_2 - 1, 2i_2) \times V_k(2j_2 - 1, 2i_2)}{\sum_{j_2=1}^{N_V/2} V_k(2j_2 - 1, 2i_2)}, & \sum_{j_2=1}^{N_V/2} V_k(2j_2 - 1, 2i_2 - 1) \neq 0 \\ 0, & \sum_{j_2=1}^{N_V/2} V_k(2j_2 - 1, 2i_2 - 1) = 0 \end{cases} \quad (3F)$$

$$G_b P_k(2i_2 - 1) = \begin{cases} \dfrac{\sum_{j_2=1}^{N_V/2} G_b I_k(2j_2, 2i_2 - 1) \times V_k(2j_2, 2i_2 - 1)}{\sum_{j_2=1}^{N_V/2} V_k(2j_2, 2i_2 - 1)}, & \sum_{j_2=1}^{N_V/2} V_k(2j_2, 2i_2 - 1) \neq 0 \\ 0, & \sum_{j_2=1}^{N_V/2} V_k(2j_2, 2i_2 - 1) = 0 \end{cases} \quad (3G)$$

-continued $$BP_k(2i_2) = \begin{cases} \dfrac{\sum_{j_2=1}^{N_V/2} BI_k(2j_2, 2i_2) \times V_k(2j_2, 2i_2)}{\sum_{j_2=1}^{N_V/2} V_k(2j_2, 2i_2)}, & \sum_{j_2=1}^{N_V/2} V_k(2j_2, 2i_2) \neq 0 \\ 0, & \sum_{j_2=1}^{N_V/2} V_k(2j_2, 2i_2) = 0 \end{cases} \quad (3H)$$

As a result, projection signals $RP_k(2i_2-1)$, $GrP(2i_2)$, $GbP_k(2i_2-1)$, and $BP_k(2i_2)$ of the kth viewpoint image are generated.

As can be understood from equations (3A) to (3D), the projection processing of step S904 is processing of calculating the sum of a pixel group (except non-effective pixels) of the captured image arranged in the direction orthogonal to the pupil division direction. The calculation of the sum is performed for each color (that is, a pixel group is decided such that all pixels correspond to a single color), and the sum is divided by the number of effective pixels for normalization. Additionally, as can be understood from equations (3E) to (3H), the projection processing of step S905 is processing of calculating the sum of a pixel group (except non-effective pixels) of the first viewpoint image $I_1$ arranged in the direction orthogonal to the pupil division direction. The calculation of the sum is performed for each color (that is, a pixel group is decided such that all pixels correspond to a single color), and the sum is divided by the number of effective pixels for normalization.

After the projection processing of equations (3A) to (3D), for smoothing, the image capturing apparatus 100 performs low-pass filter processing for the projection signals $RP(2i_2-1)$, $GrP(2i_2)$ $GbP(2i_2-1)$, and $BP(2i_2)$ of the captured image. Similarly, after the projection processing of equations (3D) to (3H), for smoothing, the image capturing apparatus 100 performs low-pass filter processing for the projection signals $RP_k(2i_2-1)$, $GrP_k(2i_2)$, $GbP_k(2i_2-1)$, and $BP_k(2i_2)$ of the kth viewpoint image. However, the low-pass filter processing may be omitted.

Figure 12A:
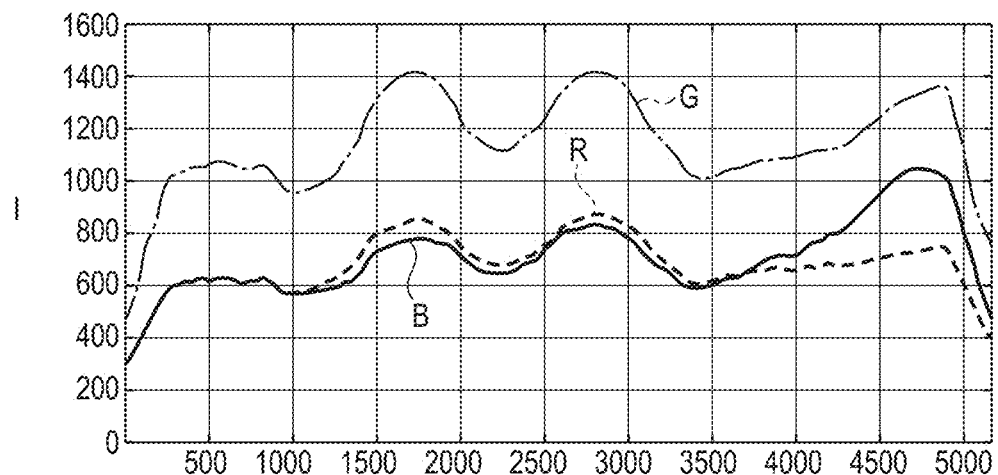
FIG. 12A is a view showing an example of the projection signal of a captured image.
Figure 12B:
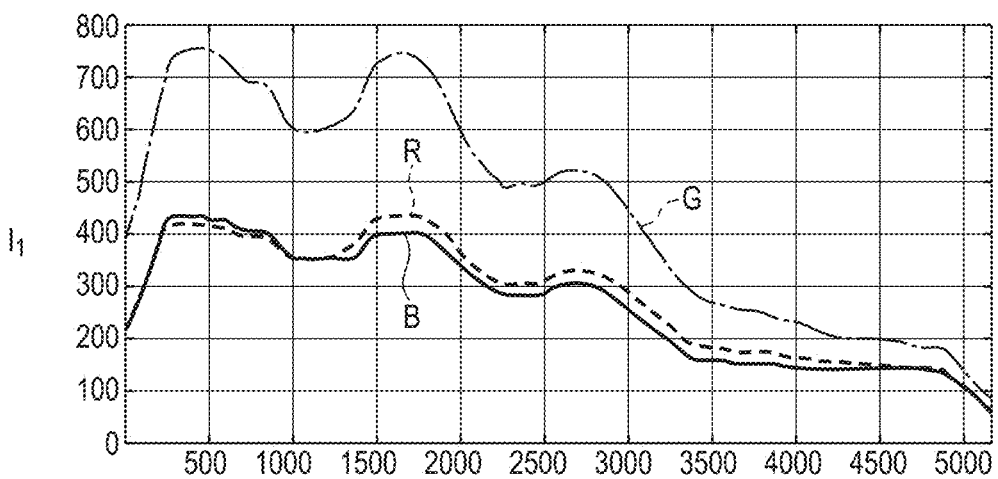
FIG. 12B is a view showing an example of the projection signal of a first viewpoint image.

FIG. 12A shows examples of projection signals RP(R), GrP(G), GbP(G), and BP(B) of the captured image, and FIG. 12B shows examples of projection signals $RP_1(R)$, $GrP_1(G)$, $GbP_1(G)$, $BP_1(B)$ of the first viewpoint image. Each projection signal has a plurality of peaks and valleys depending on the object. To accurately perform shading (light amount) correction of the first viewpoint image $I_1$, the shading components of the first viewpoint image $I_1$ generated for the RGB components by the pupil shift and the signal components of the object for the RGB components need to be separated.

For this separation, in step S906, the image capturing apparatus 100 calculates shading signals $RS_k(2i_2-1)$, $GrS_k(2i_2)$, $GbS_k(2i_2-1)$, and $BS_k(2i_2)$ of the nth viewpoint image $I_k$ for the RGB components relative to the captured image I as a reference. This calculation is done by $$RS_k(2i_2-1) = \quad (4A)$$
$$\begin{cases} \dfrac{N_{LF} \times RP_k(2i_2-1)}{RP(2i_2-1)}, & RP(2i_2-1) > RP_k(2i_2-1) > 0 \\ 0, & \text{otherwise} \end{cases}$$

-continued $$G_rS_k(2i_2) = \begin{cases} \dfrac{N_{LF} \times G_rP_k(2i_2)}{G_rP(2i_2)}, & G_rP(2i_2) > G_rP_k(2i_2) > 0 \\ 0, & \text{otherwise} \end{cases} \quad (4B)$$

$$G_bS_k(2i_2-1) = \quad (4C)$$
$$\begin{cases} \dfrac{N_{LF} \times G_bP_k(2i_2-1)}{G_bP(2i_2-1)}, & G_bP(2i_2-1) > G_bP_k(2i_2-1) > 0 \\ 0, & \text{otherwise} \end{cases}$$

$$BS_k(2i_2) = \begin{cases} \dfrac{N_{LF} \times BP_k(2i_2)}{BP(2i_2)}, & BP(2i_2) > BP_k(2i_2) > 0 \\ 0, & \text{otherwise} \end{cases} \quad (4D)$$

Here, the light receiving amount of a pixel needs to be larger than that of a sub-pixel. Additionally, to calculate a shading component, the light receiving amount of a sub-pixel needs to be larger than 0. Hence, if a condition $RP(2i_2-1) > RP_k(2i_2-1) > 0$ is satisfied in accordance with equation (4A), the image capturing apparatus 100 acquires the ratio of the projection signal $RP_k(2i_2-1)$ of the R component of the kth viewpoint image to the projection signal $RP(2i_2-1)$ of the R component of the captured image. Then, the image capturing apparatus 100 multiplies the acquired ratio by the number $N_{LF}$ of pupil divisions for normalization, thereby generating a shading signal $RS_k(2i_2-1)$ of the R component of the kth viewpoint image $I_k$. This makes it possible to cancel the R signal component of the object and separate the R shading component of the kth viewpoint image $I_k$. On the other hand, if the condition $RP(2i_2-1) > RP(2i_2-1) > 0$ is not satisfied, the image capturing apparatus 100 sets the shading signal $RS_k(2i_2-1)$ of the R component of the kth viewpoint image $I_k$ to 0.

Similarly, if a condition $GrP(2j_2) > GrP(2i_2) > 0$ is satisfied in accordance with equation (4B), the image capturing apparatus 100 acquires the ratio of the projection signal $GrP_k(2i_2)$ of the Gr component of the kth viewpoint image to the projection signal $GrP(2i_2)$ of the Gr component of the captured image. Then, the image capturing apparatus 100 multiplies the acquired ratio by the number N of pupil divisions for normalization, thereby generating a shading signal $GrS_k(2i_2)$ of the Gr component of the kth viewpoint image $I_k$. This makes it possible to cancel the Gr signal component of the object and separate the Gr shading component of the kth viewpoint image $I_k$. On the other hand, if the condition $GrP(2i_2) > GrP_k(2i_2) > 0$ is not satisfied, the image capturing apparatus 100 sets the shading signal $GrS_k(2i_2)$ of the Gr component of the kth viewpoint image $I_k$ to 0.

Similarly, if a condition $GbP(2i_2-1) > GbP_k(2i_2-1) > 0$ is satisfied in accordance with equation (4C), the image capturing apparatus 100 acquires the ratio of the projection signal $GbP_k(2i_2-1)$ of the Gb component of the kth viewpoint image to the projection signal $GbP(2i_2-1)$ of the Gb component of the captured image. Then, the image capturing apparatus 100 multiplies the acquired ratio by the number $N_{LF}$ of pupil divisions for normalization, thereby generating a shading signal $GbS_k(2i_2-1)$ of the Gb component of the kth viewpoint image $I_k$. This makes it possible to cancel the Gb signal component of the object and separate the Gb shading component of the kth viewpoint image $I_k$. On the other hand, if the condition $GbP(2i_2-1) > GbP_k(2i_2-1) > 0$ is not satisfied, the image capturing apparatus 100 sets the shading signal $GbS_k(2i_2-1)$ of the Gb component of the kth viewpoint image $I_k$ to 0.

Similarly, if a condition $BP(2i_2) > BP_k(2i_2) > 0$ is satisfied in accordance with equation (4D), the image capturing apparatus 100 acquires the ratio of the projection signal $BP_k(2i_2)$ of the B component of the kth viewpoint image to the projection signal $BP(2i_2)$ of the B component of the captured image. Then, the image capturing apparatus 100 multiplies the acquired ratio by the number $N_{LF}$ of pupil divisions for normalization, thereby generating a shading signal $BS_k(2i_2)$ of the B component of the kth viewpoint image $I_k$. This makes it possible to cancel the B signal component of the object and separate the B shading component of the kth viewpoint image $I_k$. On the other hand, if the condition $BP(2i_2) > BP_k(2i_2) > 0$ is not satisfied, the image capturing apparatus 100 sets the shading signal $BS_k(2i_2)$ of the B component of the kth viewpoint image $I_k$ to 0.

Note that to accurately perform shading correction, the shading correction is preferably performed when the number of effective shading signals is a predetermined value or more. That is, the shading correction is preferably performed when the number of effective shading signals that satisfy $RS_k(2i_2-1) > 0$, $GrS_k(2i_2) > 0$, $S_k(2i_2-1) > 0$, or $BS_k(2i_2) > 0$ is a predetermined value or more.

As can be understood from equations (4A) to (4D), a shading signal has a value associated with the ratio of the sum of a pixel group of the first viewpoint image $I_1$ arranged in the direction orthogonal to the pupil division direction to the sum of a pixel group of the captured image at positions corresponding to the pixels.

Next to shading signal generation, the image capturing apparatus 100 obtains shading functions $RSF_k(2i_2-1)$, $GrSF_k(2i_2)$, $GbSF_k(2i_2-1)$, and $BSF_k(2i_2)$ of the kth viewpoint image $I_k$ for the RGB components as smooth $N_{SF}$th-order polynomial functions for a position variable in the pupil division direction (x direction) in accordance with $$RSF_k(2i_2-1) = \sum_{\mu=0}^{N_{SF}} RSC_k(\mu) \times (2i_2-1)^\mu \quad (5A)$$

$$G_rSF_k(2i_2) = \sum_{\mu=0}^{N_{SF}} G_rSC_k(\mu) \times (2i_2)^\mu \quad (5B)$$

$$G_bSF_k(2i_2-1) = \sum_{\mu=0}^{N_{SF}} G_bSC_k(\mu) \times (2i_2-1)^\mu \quad (5C)$$

$$BSF_k(2i_2) = \sum_{\mu=0}^{N_{SF}} BSC_k(\mu) \times (2i_2)^\mu \quad (5D)$$

In addition, the image capturing apparatus 100 sets effective shading signals that are generated by equations (4A) to (4D) and satisfy $RS_k(2i_2-1) > 0$, $GrS_k(2i_2) > 0$, $GbS_k(2i_2-1) > 0$, or $BS_k(2i_2) > 0$ to data points. The image capturing apparatus 100 performs parameter fitting by the least square method using these data points, and calculates coefficients $RSC_k(\mu)$, $GrSC_k(\mu)$, $GbSC_k(\mu)$, and $BSC_k(\mu)$ of equations (5A) to (5D). The shading functions $RSF_k(2i_2-1)$, $GrSF_k(2i_2)$, $GbSF_k(2i_2-1)$, and $BSF_k(2i_2)$ of the kth viewpoint image $I_k$ for the RGB components relative to the captured image as the reference are thus generated.

Functions obtained by inverting the shading functions $RSF_k$, $GrSF_k$, $GbSF_k$, and $BSF_k$ in the pupil division direction (x direction) are defined as $R[RSF_k]$, $R[GrSF_k]$, $R[GbSF_k]$, and $R[BSF_k]$, respectively. Let $\varepsilon$ ($0 < \varepsilon < 1$) be a predetermined allowance. The image capturing apparatus 100 determines whether all conditions $1-\varepsilon \le RSF_k + R[RSF_k] \le 1+\varepsilon$, $1-\varepsilon \le GrSF_k + R[GrSF_k] \le 1+\varepsilon$, $1-\varepsilon \le GbSF_k + R[GbSF_k] \le 1+\varepsilon$, and $1-\varepsilon \le BSF_k + R[BSF_k] \le 1+\varepsilon$ are satisfied at each position. If the conditions are satisfied at each position, the image capturing apparatus 100 determines that the generated shading functions are appropriate, and performs shading correction processing (to be described later) according to equations (6A) to (6D). Otherwise, the image capturing apparatus 100 determines that the generated shading functions are inappropriate, sets $RSF_k = 1$, $GrSF_k = 1$, $GbSF_k = 1$, and $BSF_k = 1$, and performs exception processing as needed.

Figure 12C:
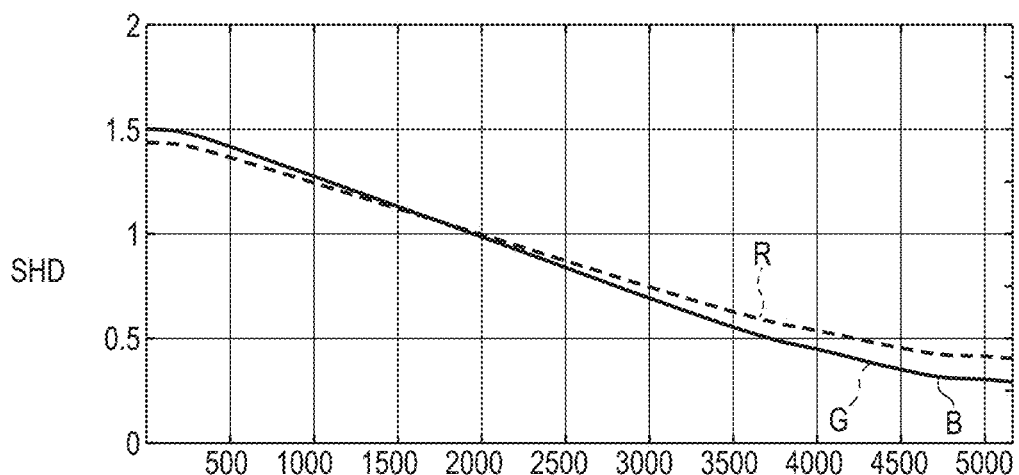
FIG. 12C is a view showing the shading function of the first viewpoint image.

FIG. 12C shows examples of shading functions $RSF_1(R)$, $GrSF_1(G)$, $GbSF_1(G)$, and $BSF_1(B)$ of the first viewpoint image $I_1$ for the RGB components relative to the captured image I as the reference. In the projection signals of the first viewpoint image $I_1$ shown in FIG. 12B and the projection signals of the captured image I shown in FIG. 12A, peaks and valleys depending on the object exist. However, the peaks and valleys depending on the object (the signal values of the RGB components of the object) can be canceled by obtaining the ratio of the projection signal of the first viewpoint image $I_1$ to the projection signal of the captured image I. It is therefore possible to separate and generate a smooth shading function of the first viewpoint image $I_1$ for each of the RGB components.

Note that in this embodiment, a polynomial function is used as a shading function. However, the present invention is not limited to this, and a more general function may be used as needed in accordance with the shading shape.

Next, in step S907, using the shading functions for the RGB components, the image capturing apparatus 100 performs shading (light amount) correction processing for the kth viewpoint image $I_k(j,i)$, thereby generating a first corrected kth viewpoint image $M_1I_k(j,i)$. The shading correction processing is performed in accordance with $$RM_1I_k(2j_2-1, 2i_2-1) = \frac{RI_k(2j_2-1, 2i_2-1)}{RSF_k(2i_2-1)} \quad (6A)$$

$$G_rM_1I_k(2j_2-1, 2i_2) = \frac{G_rI_k(2j_2-1, 2i_2)}{G_rSF_k(2i_2)} \quad (6B)$$

$$G_bM_1I_k(2j_2, 2i_2-1) = \frac{G_bI_k(2j_2, 2i_2-1)}{G_bSF_k(2i_2-1)} \quad (6C)$$

$$BM_1I_k(2j_2, 2i_2) = \frac{BI_k(2j_2, 2i_2)}{BSF_k(2i_2-1)} \quad (6D)$$

Here, let $RM_1I_k(2j_2-1, 2i_2-1) = M_1I_k(2j_21, 2i_2-1)$ be the R component of the first corrected kth viewpoint image $M_1I_k$ with the Bayer arrangement, and $GrM_1I_k(2j_21, 2i_2) = M_1I_k(2i_2-1, 2i_2)$ be the Gr component. In addition, let $GbM_1I_k(2j_2, 2i_2-1) = M_1I_k(2j_2, 2i_2-1)$ be the Gb component, and $BM_1I_k(2i_2, 2i_2)$ $M_1I_k(2i_2, 2i_2)$ be the B component.

In this embodiment, the image capturing apparatus 100 cancels a signal change in the captured image by the object and a signal change in the viewpoint image by the object based on the captured image and the viewpoint image, and calculates the shading functions for the RGB components. The image capturing apparatus 100 then calculates the shading correction amount (light amount correction amount) for each of the RGB components using the reciprocal of the shading function. The image capturing apparatus 100 performs shading (light amount) correction processing of the viewpoint image based on the calculated shading correction amount (light amount correction amount).

In this embodiment, a signal change by the object is canceled by using the ratio of the sum of a pixel group of the first viewpoint image $I_1$ arranged in the direction orthogonal to the pupil division direction to the sum of a pixel group of the captured image at positions corresponding to the pixels. When the sum in the direction orthogonal to the pupil division direction is used, a signal change by the object can be canceled while suppressing loss of parallax information in the pupil division direction.

Figure 13:
FIG. 13 is a view showing an example of a captured image I.
Figure 14:
FIG. 14 is a view showing an example of a first viewpoint image before shading correction.
Figure 15:
FIG. 15 is a view showing an example of a first corrected first viewpoint image $M_1I_1$ after shading correction.

The effect of the shading (light amount) correction processing of the first viewpoint image $I_1$ for each of the RGB components shown in steps S903 to S907 of FIG. 9 will be described below with reference to FIGS. 13 to 15. FIG. 13 shows an example of the captured image I (after demosaicing). This is an example of a captured image of high quality. FIG. 14 shows an example of the first viewpoint image $I_1$ (after demosaicing) before shading correction. This is an example in which shading is caused for each of the RGB components by the pupil shift between the exit pupil 400 of the imaging optical system and the entrance pupil of the image sensor 107, and a decrease is luminance and a modulation of the RGB ratio occur on the right side of the first view mint image $I_1$. FIG. 15 shows an example of a first corrected first viewpoint image (after demosaicing) after shading correction according to this embodiment. By shading correction for each of the RGB components based on the captured image, the decrease in luminance and the modulation of the RGB ratio are corrected, and the first corrected first viewpoint image $M_1 I_1$ after the shading correction, which has high quality like the captured image I, is generated.

The first corrected kth viewpoint image $M_1 I_k$ generated by the above-described processing is used for flaw correction processing to be described next. However, the image capturing apparatus 100 may store the first corrected kth viewpoint image $M_1 I_k$ as an output image in the flash memory 133, as needed.

Flaw Correction Processing of Viewpoint Image (S908)

In step S908, the image capturing apparatus 100 performs defect correction (flaw correction) of the first corrected kth viewpoint image $M_1 I_k$ based on the captured image I. An explanation will be made assuming that k=1, as described above. In this embodiment, in some cases, the captured image I is normal but a defective signal is generated in part of the first viewpoint image $I_1$ to result in a point defect or line defect because of, for example, a short circuit of a transfer gate depending on the circuit arrangement or driving method of the image sensor 107. The image capturing apparatus 100 may record point defect information or line defect information inspected in the mass production step or the like in advance in the image processing circuit 125 or the like, as needed, and perform defect correction processing of the first viewpoint image $I_1$ using the recorded point defect information or line defect information. The image capturing apparatus 100 may also perform point defect determination or line defect determination, as needed, by inspecting the first viewpoint image $I_1$ in real time.

Defect correction of step S908 will be described using an example in which an odd-numbered row $2j_D-1$ or an even-numbered row $2j_D$ of the kth viewpoint image is determined as a line defect in the horizontal direction (x direction), and the odd-numbered row $2j_D-1$ or the even-numbered row $2j_D$ of the captured image I is not determined as a line defect.

Using the normal captured image I as a reference image, the image capturing apparatus 100 performs defect correction of the first corrected kth viewpoint image $M_1 I_k$ based on the captured image I. In the defect correction according to this embodiment, defect correction is performed by comparing a signal value of the first corrected kth viewpoint image $M_1 I_k$ at a position not determined a defect with a signal value of the captured image I at a position not determined a defect. When performing this comparison, it is important, for accuracy improvement, to eliminate the influence of the shading component of kth viewpoint image $I_k$ generated by the pupil shift for each of the RGB components. This is because it is necessary, for accurate defect correction, to correctly compare the RGB signal components of the object between the kth viewpoint image $I_k$ and the captured image I. Hence, in the defect correction, (not the kth viewpoint image $I_k$ but) the first corrected kth viewpoint image $M_1 I_k$ is used.

The image capturing apparatus 100 performs defect correction processing for a defective signal of the first corrected kth viewpoint image $M_1 I_k(j,i)$ using a normal signal of the captured image I and a normal signal of the first corrected kth viewpoint image $M_1 I_k$. The kth viewpoint image after defect correction will be referred to as a second corrected kth viewpoint image $M_2 I_k(j,i)$. Defect correction is performed in accordance with $$RM_2 I_k(2j_D - 1, 2i_D - 1) = \qquad (7A)$$
$$RI(2j_D - 1, 2i_D - 1) \times \frac{\sum_{\tau=\pm 2}\sum_{\sigma=0,\pm 2} RM_1 I_k(2j_D - 1 + \tau, 2i_D - 1 + \sigma)}{\sum_{\tau=\pm 2}\sum_{\sigma=0,\pm 2} RI(2j_D - 1 + \tau, 2i_D - 1 + \sigma)}$$

$$G_r M_2 I_k(2j_D - 1, 2i_D) = \qquad (7B)$$
$$G_r I(2j_D - 2i_D) \times \frac{\sum_{\tau=\pm 1}\sum_{\sigma=0,\pm 1} G_b M_1 I_k(2j_D - 1 + \tau, 2i_D + \sigma)}{\sum_{\tau=\pm 1}\sum_{\sigma=0,\pm 1} G_b I(2j_D - 1 + \tau, 2i_D + \sigma)}$$

$$G_b M_2 I_k(2j_D, 2i_D - 1) = \qquad (7C)$$
$$G_b I(2j_D, 2i_D - 1) \times \frac{\sum_{\tau=\pm 1}\sum_{\sigma=0,\pm 1} G_r M_1 I_k(2j_D + \tau, 2i_D - 1 + \sigma)}{\sum_{\tau=\pm 1}\sum_{\sigma=0,\pm 1} G_r I(2j_D + \tau, 2i_D - 1 + \sigma)}$$

$$BM_2 I_k(2j_D, 2i_D) = \qquad (7D)$$
$$BI(2j_D, 2i_D) \times \frac{\sum_{\tau=\pm 2}\sum_{\sigma=0,\pm 2} BM_1 I_k(2j_D + \tau, 2i_D + \sigma)}{\sum_{\tau=\pm 2}\sum_{\sigma=0,\pm 2} BI(2j_D + \tau, 2i_D + \sigma)}$$

Here, let $RM_2 I_k(2j_2-1, 2i_2-1) = M_2 I_k(2j_2-1, 2i_2-1)$ be the R component of the second corrected kth viewpoint image $M_2 I_k$ with the Bayer arrangement, and $GrM_2 I_k(2j_2-1, 2i_2) = M_2 I_k(2j_2-1, 2i_2)$ be the Gr component. In addition, let $GbM_2 I_k(1 2, 2i_2-1) = M_2 I_k(2j_2, 2i_2-1)$ be the Gb component, and $BM_2 I_k(2j_2, 2i_2) = M_2 I_k(2j_2, 2i_2)$ be the B component.

If a first position $(2j_D-1, 2i_D-1)$ of the B component of the first corrected kth viewpoint image $M_1 I_k$ is determined as a defect, the image capturing apparatus 100 performs defect correction processing in accordance with equation (7A), and generates a second corrected kth viewpoint image $RM_2I_k$ $(2j_D-1,2i_D-1)$ at the first position. In equation (7A), as values τ and σ, only values corresponding to a position (second position) that is not determined as a defect in a first corrected kth viewpoint image of the R component are used.

Similarly, if a first position $(2j_D-1,2i_D)$ of the Gr component of the first corrected kth viewpoint image $M_1I_k$ is determined as a defect, the image capturing apparatus 100 performs defect correction processing in accordance with equation (7B), and generates a second corrected kth viewpoint image $GrM_2I_k(2j_D-1,2i_D)$ at the first position. In equation (7B), as the values τ and σ, only values corresponding to a position (second position) that is not determined as a defect in a first corrected kth viewpoint image $GrM_1I_k$ of the Gr component are used.

Similarly, if a first position $(2j_D,2i_D-1)$ of the Gb component of the first corrected kth viewpoint image $M_1I_k$ is determined as a defect, the image capturing apparatus 100 performs defect correction processing in accordance with equation (7C), and generates a second corrected kth viewpoint image $GbM_2I_k(2j_D, 2i_D-1)$ at the first position. In equation (7C), as the values τ and σ, only values corresponding to a position (second position) that is not determined as a defect in a first corrected kth viewpoint image $GbM_1I_k$ of the Gb component are used.

Similarly, if a first position $(2j_D, 2i_D)$ of the B component of the first corrected kth viewpoint image $M_1I_k$ is determined as a defect, the image capturing apparatus 100 performs defect correction processing in accordance with equation (7D), and generates a second corrected kth viewpoint image $BM_2I_k(2j_D, 2i_D)$ at the first position. In equation (7D), as the values τ and σ, only values corresponding to a position (second position) that is not determined as a defect in a first corrected kth viewpoint image $BM_1I_k$ of the B component are used.

For a position (j, i) that is not determined as a defect in the first corrected kth viewpoint image $M_1I_1$, the second corrected kth viewpoint image $M_2I_k(j,i)$ has the same signal value as that in the first corrected kth viewpoint image $M_1I_k(j,i)$. That is, $M_2I_k(j,i)=M_1I_k(j,i)$.

Figure 16:
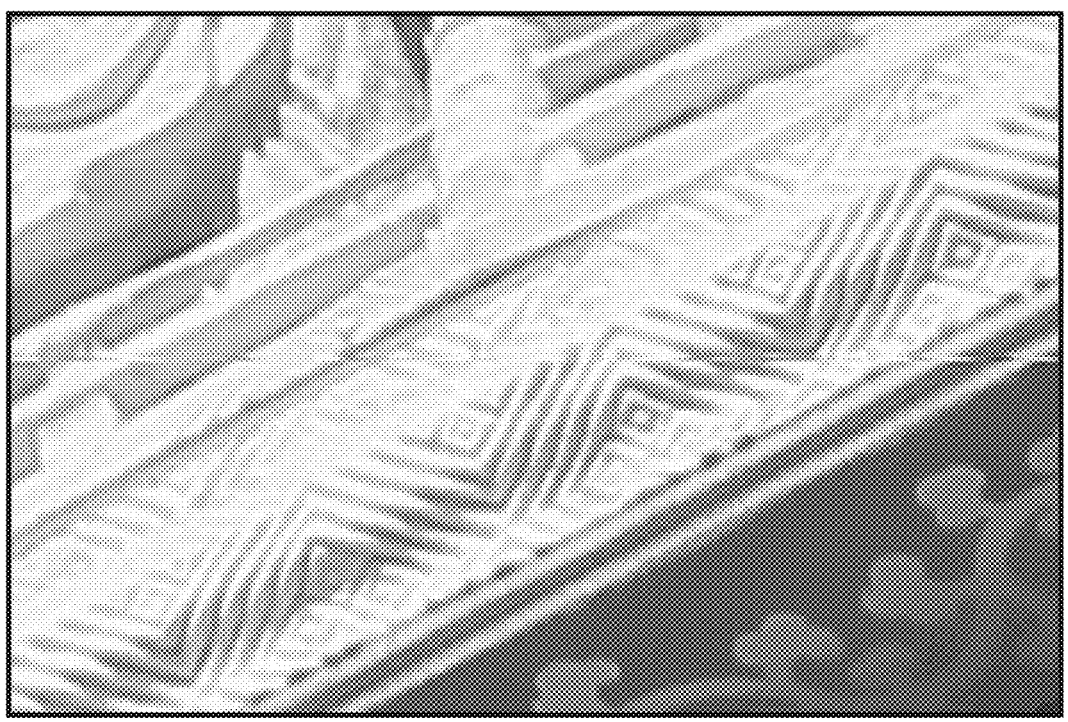
FIG. 16 is a view showing an example of the first corrected first viewpoint image $M_1I_1$ before defect correction.
Figure 17:
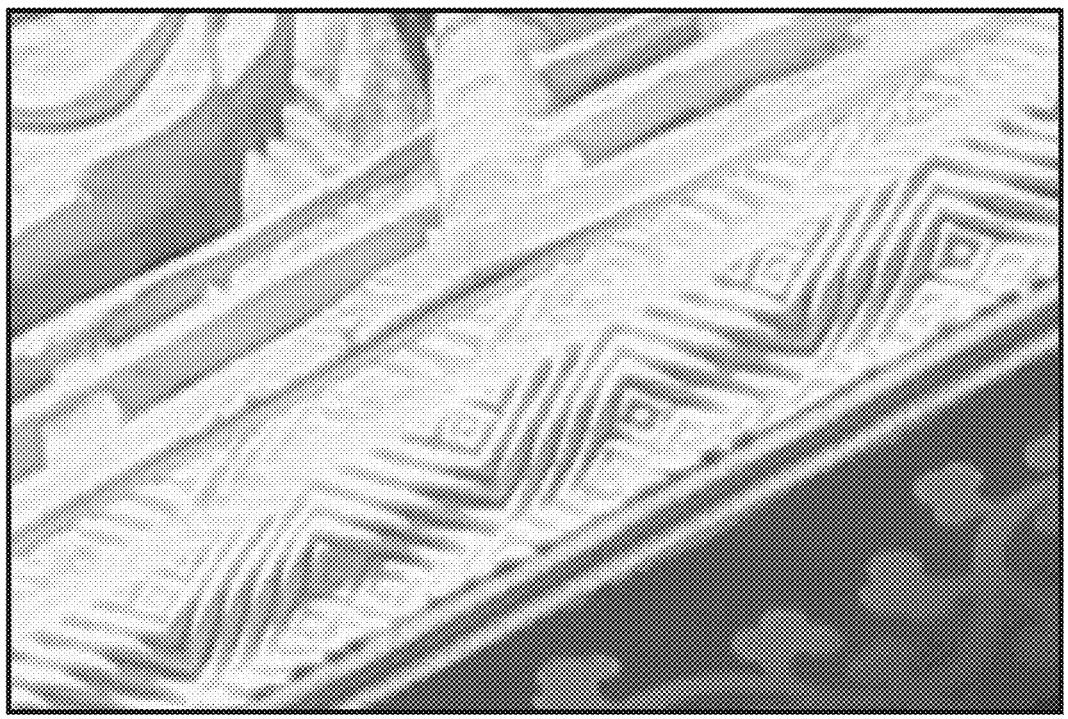
FIG. 17 is a view showing an example of a second corrected first viewpoint image $M_2I_1$ after defect correction.

The effect of defect correction processing of the first corrected first viewpoint image $M_1I_1$ shown in step S908 will be described below with reference to FIGS. 16 and 17. FIG. 16 shows an example of the first corrected first viewpoint image $M_1I_1$ (after shading, after demosaicing) before defect correction. This is an example in which a linear defect (line defect) in the horizontal direction (x direction) is generated at the center of the first corrected first viewpoint image $M_1I_1$. FIG. 17 shows an example of the second corrected first viewpoint image $M_2I_1$ (after shading, after demosaicing) after defect correction. The line defect in the horizontal direction (x direction) is corrected by defect correction based on the normal captured image I, and the second corrected first viewpoint image $M_2I_1$ after the defect correction, which has high quality like the captured image I, is generated.

The second corrected kth viewpoint image $M_2I_k$ generated by the above-described processing is used for re-shading processing to be described next. However, the image capturing apparatus 100 may store the second corrected kth viewpoint image $M_2I_k$ as an output image in the flash memory 133, as needed.

Re-Shading Processing of Viewpoint Image (S909)

In step S909, the image capturing apparatus 100 generates a third corrected kth viewpoint image $M_3I_k(j,i)$ by performing re-shading processing for the second corrected kth viewpoint image $M_2I_k(j,i)$ after the defect correction in accordance with $$RM_3I_k(2j_2-1,2i_2-1)=RSF_k(2j_2-1)\times RM_2I_k(2j_2-1,2i_2-1) \quad (8A)$$

$$G_rM_3I_k(2j_2-1,2i_2)=G_rSF_k(2i_2)\times G_rM_2I_k(2j_2-1,2i_2) \quad (8B)$$

$$G_bM_3I_k(2j_2,2i_2-1)=G_bSF_k(2i_2-1)\times G_bM_2I_k(2j_2,2i_2-1) \quad (8C)$$

$$BM_3I_k(2j_2,2i_2)=BSF_k(2i_2)\times BM_2I_k(2j_2,2i_2) \quad (8D)$$

Here, let $RM_3I_k(2j_2-1,2i_2-1)=M_3I_k(2j_2-1,2i_2-1)$ be the R component of the third corrected kth viewpoint image $M_3I_k$ with the Bayer arrangement, and $GrM_3I_k(2j_2-1,2i_2)=M_3I_k(2j_2-1,2i_2)$ be the Gr component. In addition, let $GbM_3I_k(2j_2,2i_2)=M_3I_k(2j_2,2i_2-1)$ be the Gb component, and $BM_3I_k(2j_2,2i_2)=M_3I_k(2j_2,2i_2)$ be the B component.

Saturation Signal Processing of Captured Image and Viewpoint Image (S910 and S911)

Next, the image capturing apparatus 100 performs saturation signal processing for the captured image I(j,i) and the third corrected kth viewpoint image $M_3I_k$. The explanation will be made continuously using the example in which k=1, and $N_{LF}=2$.

In step S910, defining the maximum value of the imaging signal as $I_{max}$, the image capturing apparatus 100 generates a corrected captured image MI(j,i) by performing saturation signal processing for the captured image I(j,i) is accordance with $$MI(j, i) = \begin{cases} I_{max}, & I(j, i) > I_{max} \\ I(j, i), & \text{otherwise} \end{cases} \quad (9)$$

Here the maximum value $I_{max}$ of the imaging signal and the saturation determination threshold IS of the imaging signal satisfy $I_{max} \geq IS$.

In step S911, the image capturing apparatus 100 generates a fourth corrected kth viewpoint image $M_4I_k(j,i)$ by performing saturation signal processing according to the shading state for the third corrected kth viewpoint image $M_3I_k$ in accordance with.

$$M_4I_k(j, i) = \begin{cases} \dfrac{I_{max}}{N_{LF}}SF_k(j, i), & M_3I_k(j, i) > \dfrac{I_{max}}{N_{LF}}SF_k(j, i) \\ M_3I_k(j, i), & \text{otherwise} \end{cases} \quad (10)$$

where $SF_k(j,i)$ is the shading function of the Bayer arrangement obtained by equations (5A) to (5D), and $SF_k(2j_2-1, 2i_2-1)=RSF_k(2i_2-1)$. In addition, $SF_k(2j_2-1,2i_2)=GrSF_k(2i_2)$, $SF_k(2j_2,2i_2-1)=GbSF_k(2i_2-1)$, and $SF_k(2j_2,2i_2)=BSF_k(2i_2)$.

Generation Processing of Second Viewpoint Image (S912)

In step S912, the image capturing apparatus 100 generates the second viewpoint image $I_2(j,i)$ from the corrected captured image MI(j,i) and a fourth corrected first viewpoint image $M_4I_1(j,i)$ in accordance with $$I_2(j,i)=MI(j,i)-M_4I_1(j,i) \quad (11)$$

In this embodiment, the maximum signal value of the third corrected first viewpoint image $M_3I_1(j,i)$ at the time of saturation is sometimes equal to the maximum signal value $I_{max}$ of the captured image I(j,i) at the time of saturation depending on the driving method of the image sensor 107 or the circuit arrangement of A/D conversion. In that case, assume a case in which the second viewpoint image $I_2$ is generated by subtracting the third corrected first viewpoint image $M_3I_1$ from the captured image I, as in equation (11), without performing saturation signal processing. On this assumption, the second viewpoint image $I_2$ that should have the saturated signal value may have a wrong signal value of 0. To prevent this problem, in this embodiment, the image capturing apparatus 100 performs saturation signal processing according to the shading state for the captured image I and the third corrected kth viewpoint image $M_3I_k$ in advance in step S910 and S911. Then, after the corrected captured image MI and the fourth corrected first viewpoint image $M_4I_1$ are generated by the saturation signal processing, the image capturing apparatus 100 generates the second viewpoint image $I_2$ in accordance with equation (11) in step S912. This makes it possible to generate the second viewpoint image $I_2$ corresponding to a more correct saturated signal value.

Shading Correction Processing of First Viewpoint Image and Second Viewpoint Image (S913 to S915)

Next, the image capturing apparatus 100 performs shading (light amount) correction for the fourth corrected first viewpoint image $M_4I_1(j,i)$ and the second viewpoint image $I_2(j,i)$.

In step S913, the image capturing apparatus 100 performs shading (light amount) correction processing for the fourth corrected first viewpoint image $M_4I_1$, as in step S907 (see equations (6A) to (6D)), thereby generating a fifth corrected first viewpoint image $M_5I_1$. At this time, the image capturing apparatus 100 uses the functions already generated in step S906 as the shading functions $RSF_1$, $GrSF_1$, $GbSF_1$, and $BSF_1$.

In step S914, the image capturing apparatus 100 generates shading functions $RSF_2$, $GrSF_2$, $GbSF_2$, and $BSF_2$ of the second viewpoint image $I_2$, as in steps S903 to S906 (see equations (3A) to (5D)). In step S915, the image capturing apparatus 100 performs shading (light amount) correction processing for the second viewpoint image $I_2$ using the shading functions generated in step S914, as in step S907 (see equations (6A) to (6D)), thereby generating a fifth corrected second viewpoint image $M_5I_2$.

Saturation Signal Processing of First Viewpoint image and Second Viewpoint Image (S916 and S917)

In step S916, the image capturing apparatus 100 generates a final corrected first viewpoint image $MI_1(j,i)$ that is an output image by performing saturation signal processing for the fifth corrected first viewpoint image $M_5I_1(j,i)$ in accordance with $$MI_k(j, i) = \begin{cases} \frac{I_{max}}{N_{LF}}, & M_5I_k(j, i) > \frac{I_{max}}{N_{LF}} \\ M_5I_k(j, i), & \text{otherwise} \end{cases} \quad (12)$$

Here, a maximum value $I_{max}/N_{LF}$ of the kth viewpoint image $I_k$ and the saturation determination threshold $IS_k$ of the kth viewpoint image $I_k$ satisfy $I_{max}/N_{LF} \geq IS_k$. Similarly, in step S917, the image capturing apparatus 100 performs saturation signal processing for the fifth corrected second viewpoint image $M_5I_2(j,i)$ in accordance with equation (12), thereby generating a final corrected second viewpoint image $MI_2(j,i)$ that is an output image. Note that the term "final" correction is used for the sake of convenience and does not mean inhibiting further execution of some correction later.

Figure 18:
FIG. 18 is a view showing an example of a second viewpoint image $I_2$ before shading correction.

The effect of the shading (light amount) correction processing of the second viewpoint image $I_2$ for each of the RGB components shown in steps S914 and S915 of FIG. 9 will be described below with reference to FIGS. 18 and 19. FIG. 18 shows an example of the second viewpoint image $I_2$ (after demosaicing) before shading correction. This is an example in which shading is caused for each of the RGB components by the pupil shift between the exit pupil 400 of the imaging optical system and the entrance pupil of the image sensor 107, and a decrease in luminance and a modulation of the RGB ratio occur on the left side of the second viewpoint image $I_2$. FIG. 19 shows an example of the final corrected second viewpoint image $MI_2$ (after demosaicing) after shading correction according to this embodiment. By shading correction for each of the RGB components based on the captured image, the decrease in luminance and the modulation of the RGB ratio are corrected, and the final corrected second viewpoint image $MI_2(j,i)$ after the shading correction, which has high quality the captured image I, is generated.

As described above, according to the first embodiment, the image capturing apparatus 100 performs correction processing of a viewpoint image using a captured image. This can improve the quality of the viewpoint image.

Second Embodiment

In the second embodiment, focus detection processing of detecting a defocus amount by a phase difference method from a first viewpoint image and a second viewpoint image (from the first viewpoint image to an $N_{LF}$th viewpoint image) based on the correlation (degree of matching of signals) between the first viewpoint image and the second viewpoint image will be described. In this embodiment, the basic arrangement of an image capturing apparatus 100 is the same as in the first embodiment (see FIG. 1). Points different from the first embodiment will mainly be described below.

First, the image capturing apparatus 100 generates a kth viewpoint luminance signal Yk from a kth viewpoint image $I_k$ (k=1 to $N_{LF}$) formed from RGB signals of a Bayer arrangement in accordance with $$Y_k(j, i) = \begin{pmatrix} I_k(j-1, i-1) & I_k(j-1, i) & I_k(j-1, i+1) \\ I_k(j, i-1) & I_k(j, i) & I_k(j, i+1) \\ I_k(j+1, i-1) & I_k(j+1, i) & I_k(j+1, i+1) \end{pmatrix} \begin{pmatrix} \frac{1}{16} & \frac{2}{16} & \frac{1}{16} \\ \frac{2}{16} & \frac{4}{16} & \frac{2}{16} \\ \frac{1}{16} & \frac{2}{16} & \frac{1}{16} \end{pmatrix} \quad (13)$$

by matching the color centers of gravity of RGB components for each position (j, i).

Next, the image capturing apparatus 100 calculates a shading correction amount $S_k(i)$ of the kth viewpoint luminance signal Yk (k=1 to $N_{LF}$) as a smooth $N_s$th-order polynomial function for the position i in the pupil division direction (a direction) in accordance with $$S_k(i) = \sum_{\mu=0}^{N_s} SC_k(\mu \mid F, Dl) \times i^\mu \quad (14)$$

Based on the optical characteristics (the pupil intensity distribution for each kth sub-pixel) of the image sensor 107 and the optical characteristics (an f-number F and an exit pupil distance D1) of the imaging optical system, the image capturing apparatus 100 calculates each coefficient $SC_k(\mu|F, D1)$ and saves it in a ROM (not shown) or the like.

In addition, the image capturing apparatus 100 generates a corrected kth viewpoint luminance signal $MY_k(j,i)$ by performing shading correction processing using the shading correction amount $S_k(i)$ for the kth viewpoint luminance signal $Yk(j,i)$ in accordance with $$MY_k(j, i) = \frac{Y_k(j, i)}{S_k(i)} \quad (15)$$

The image capturing apparatus 100 performs one-dimensional hand-bass filter processing for a generated corrected first viewpoint luminance signal $MY_1$ in the pupil division direction (column direction), thereby generating a first focus detection signal dYA. Similarly, the image capturing apparatus 100 performs one-dimensional band-bass filter processing for a corrected second viewpoint luminance signal $MY_2$ in the pupil division direction (column direction), thereby generating a second focus detection signal dYB. Note that as the one-dimensional band-bass filter, for example, a primary differentiation filter [1, 5, 8, 8, 8, 8, 5, 1, −1, −5, −8, −8, −8, −8, −5, −1] can be used. The pass band of the one-dimensional band-bass filter may be adjusted as needed.

Next, the image capturing apparatus 100 shifts the first focus detection signal dYA and the second focus detection signal dYB relatively in the pupil division direction (column direction), calculates a correlation amount representing the degree of matching of signals, and generates an image shift amount $M_{DIS}$ based on the calculated correlation amount.

For example, let $dYA(j_{AF}+j_2, i_{AF}+i_2)$ be the first focus detection signal that is the $j_2$th in the row direction and the $i_2$th in the column direction that is the pupil division direction with respect to a focus detection position $(j_{AF}, i_{AF})$ as the center, and $dYB(j_{AF}+j_2, i_{AF}+i_2)$ be the second focus detection signal, where $j_2$ satisfies $-n_2 \leq j_2 \leq n_2$, and $i_2$ satisfies $-m_2 \leq i_2 \leq m_2$. Also let s $(-n_s \leq s \leq n_s)$ be the shift amount. Then, a correlation amount $COR_{EVEN}(j_{AF}, i_{AF}, s)$ and a correlation amount $COR_{ODD}(j_{AF}, i_{AF}, s)$ at each position $(j_{AF}, i_{AF})$ can be calculated by $$COR_{even}(j_{AF}, i_{AF}, s) = \sum_{j_2=-n_2}^{n_2} \sum_{i_2=-m_2}^{m_2} |dYA(j_{AF}+j_2, i_{AF}+i_2+s) - dYB(j_{AF}+j_2, i_{AF}+i_2-s)| \quad (16A)$$

$$COR_{odd}(j_{AF}, i_{AF}, s) = \sum_{j_2=-n_2}^{n_2} \sum_{i_2=-m_2}^{m_2} |dYA(j_{AF}+j_2, i_{AF}+i_2+s) - dYB(j_{AF}+j_2, i_{AF}+i_2-1-s)| \quad (16B)$$

Note that the correlation amount $COR_{ODD}(j_{AF}, i_{AF}, s)$ is a correlation amount obtained by shifting the shift amount of the first focus detection signal dYA and the second focus detection signal dYB by a half phase −1 with respect to the correlation amount $COR_{EVEN}(j_{AF}, i_{AF}, s)$.

The image capturing apparatus 100 calculates a shift amount is a real number that minimizes the correlation amount from each of the correlation amount $COR_{EVEN}(j_{AF}, i_{AF}, s)$ and the correlation amount $COR_{ODD}(j_{AF}, i_{AF}, s)$ by performing a sob-pixel operation. The image capturing apparatus 100 also calculates the average value of the calculated shift amounts and detects an image shift amount $Dis(j_{AF}, i_{AF})$ at a focus detection position $(j_{AF}, i_{AF})$.

Next, the image capturing apparatus 100 multiplies the image shift amount $Dis(j_{AF}, i_{AF})$ by a conversion coefficient K from the image shift amount to the defocus amount for each image height position of the focus detection region, and detects a defocus amount $M_{Def}(j_{AF}, i_{AF})$ at each focus detection position $(j_{AF}, i_{AF})$. Note that the conversion coefficient K is calculated in accordance with, for example, the optical characteristics (the pupil intensity distribution for each kth sub-pixel) and lens information (the f-number F and the exit pupil distance D1 of the imaging optical system) of the image sensor, and saved in a ROM (not shown) or the like.

Finally, the image capturing apparatus 100 drives the lens to an in-focus position in accordance with the defocus amount $M_{Def}(j_{AF}, i_{AF})$ detected at the focus detection position $(j_{AF}, i_{AF})$ and ends the focus detection processing.

When performing automatic focus detection using the first viewpoint image and the second viewpoint image (a plurality of viewpoint images), high-speed shading correction may be needed to perform real-time automatic focus detection processing with excellent responsiveness. Hence, in this embodiment, when performing automatic focus detection, shading correction may be performed at a high speed using shading correction associated data calculated in advance and saved in a ROM (not shown) or the like. This makes it possible to use a high-quality focus detection signal of a phase difference method and implement accurate automatic focus detection with excellent responsiveness. Note that the shading correction associated data can be calculated based on the optical characteristics (the pupil intensity distribution for each kth sub-pixel) of the image sensor and the optical characteristics (the f-number F and the exit pupil distance D1) of the imaging optical system. In this case, when performing automatic focus detection, shading correction may be applied to only a specific viewpoint image (for example, the first viewpoint image) to perform the automatic focus detection at a higher speed.

In this embodiment, when outputting viewpoint images of high quality or a composite image of these images, accurate shading correction for each of the RGB components is performed based on the captured image. On the other hand, an example has been described in which when performing real-time automatic focus detection processing that requires high responsiveness, the shading correction method is switched to perform high-speed shading correction using shading correction associated data calculated and saved in a storage medium in advance. Accordingly, both output of high-quality viewpoint images and accurate automatic focus detection with excellent responsiveness can be implemented.

Figure 24:
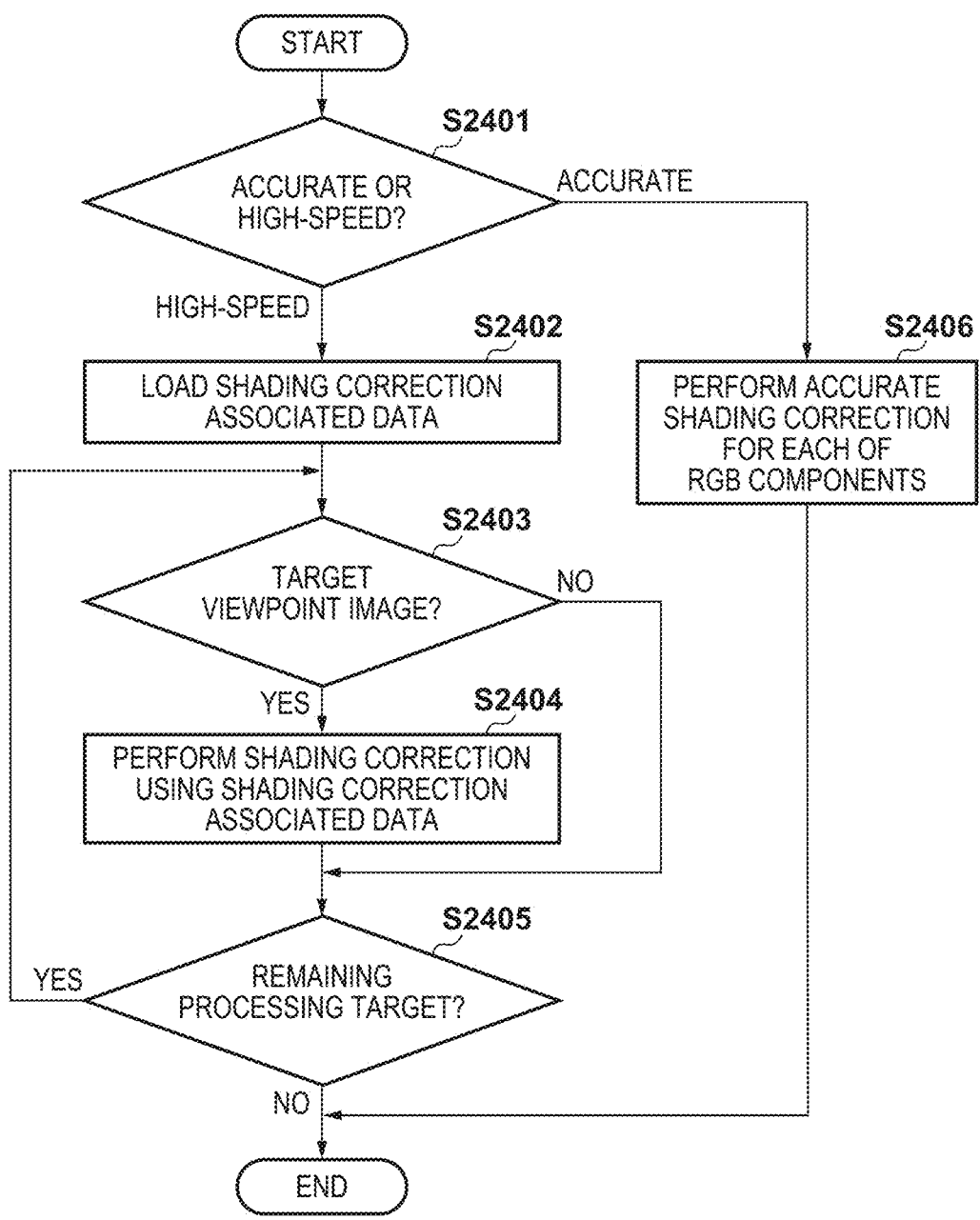
FIG. 24 is a flowchart for explaining processing of selectively executing accurate shading correction and high-speed shading correction.

An operation of shading correction processing of selectively executing high-speed shading correction and accurate shading correction will be described with reference to FIG. 24. Note that, the processes of steps shown in FIG. 24 are implemented when a CPU 121 controls the units of the image capturing apparatus 100 in accordance with a control program, like the processes shown in FIGS. 9 and 10, unless specifically stated otherwise.

In step S2401, the image capturing apparatus 100 determines whether to perform shading correction at a high speed or high accuracy. For example, when performing high-speed automatic focus detection, the image capturing apparatus 100 advances to step S2402 to perform shading correction at a high speed. Otherwise, for example, when outputting viewpoint images of high quality or a composite image of these images, the process advances to step S2400 to perform accurate shading correction.

In step S2402, the image capturing apparatus 100 loads saved shading correction associated data. In step S2403, the image capturing apparatus 100 determines whether a processing target viewpoint image of the viewpoint images is the shading correction target. If the processing target viewpoint image is the shading correction target, the process advances to step S2404. Otherwise, the process advances to step S2405 without performing shading correction for the viewpoint image. In step S2404, the image capturing apparatus 100 performs shading correction of the viewpoint image using the loaded shading correction associated data. In step S2405, the image capturing apparatus 100 determines whether a viewpoint image that is not evaluated in step S2403 remains. If all viewpoint images are evaluated in step S2403, the series of processes ends. Otherwise, the process returns to step S2403 to repeat the processing for a viewpoint image.

In step S2406, the image capturing apparatus 100 executes the above-described shading correction for each of the RGB components based on the captured image, and ends the series of processes. With this processing, high-speed shading correction and accurate shading correction can selectively be executed.

Third Embodiment

In the first embodiment, the description has been made assuming that $N_x=2$, $N_y=1$, and $N_{LF}=2\times1=2$. In the third embodiment, generalizing to $N_x \geq 2$, $N_y \geq 2$, and $N_{LF}=N_x \times N_y$ will be explained. In this embodiment, the basic arrangement of an image capturing apparatus 100 is the same as in the first embodiment (see FIG. 1). Correction processing of viewpoint images (FIGS. 9 and 10) based on a captured image is also almost the same as in the first embodiment except points to be described below. A description assuming $N_{LF}=2$ in the first embodiment is changed to a description not limited to $N_{LF}=2$. For example, a description "a first sub-pixel 201 and a second sub-pixel 202" indicating all sub-pixels of a specific pixel is changed to "a first sub-pixel to an $N_{LF}$th sub-pixel". In addition, a description "a first photoelectric conversion unit 301 and a second photoelectric conversion unit 302" indicating all photoelectric conversion units of a specific pixel is changed to "a first photoelectric conversion unit to an $N_{LF}$th photoelectric conversion unit". Similarly, a change from "a first partial pupil region 501 and a second partial pupil region 502" to "a first partial pupil region to an $N_{LF}$th partial pupil region", a change from "a first viewpoint image and a second viewpoint image" to "a first viewpoint image to an $N_{LF}$th viewpoint image", and the like are done as needed. Points different from the first embodiment will mainly be described below.

Figure 20:
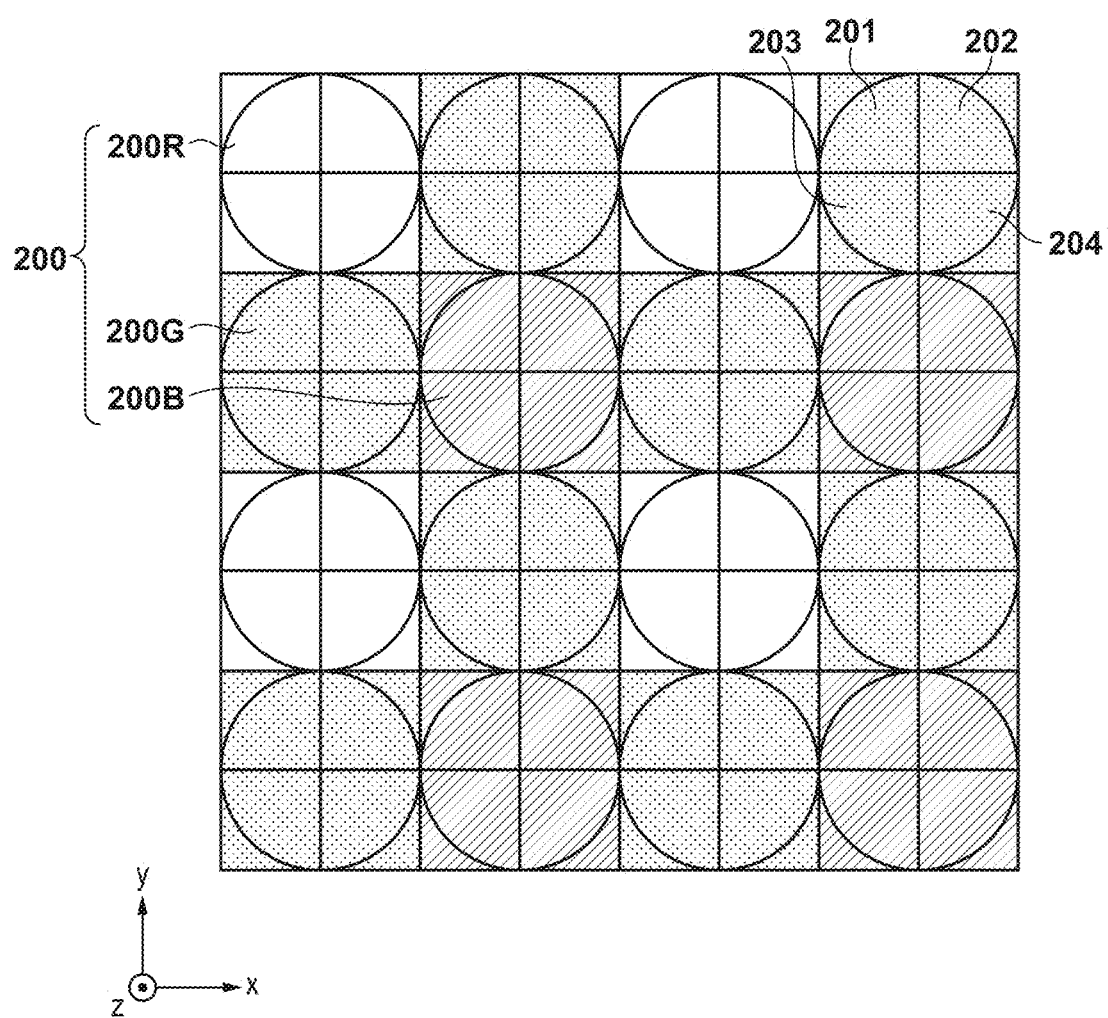
FIG. 20 is a schematic view of the array of the pixels and sub-pixels of an image sensor 107 according to the third embodiment.

FIG. 20 is a schematic view of the array of the pixels and sub-pixels of an image sensor 107 according to the third embodiment. The left-and-right direction of FIG. 20 is defined as an x direction (horizontal direction), the top-and-bottom direction as a y direction (vertical direction), and a direction (a direction perpendicular to the sheet surface) orthogonal of the x and y directions as a z direction (optical axis direction). FIG. 20 shows the pixel (imaging pixel) array of the image sensor 107 (two-dimensional CMOS sensor) in the range of 4 columns×4 rows, and the sub-pixel array in the range of 8 columns×8 rows.

In this embodiment, in a pixel group 200 of 2 columns×2 rows shown in FIG. 20, a pixel 200R having a spectral sensitivity of R (red) is arranged at the upper left position, pixels 200E having a spectral sensitivity of G (green) are arranged at the upper right and lower left positions, and a pixel 200B having a spectral sensitivity of B (blue) is arranged at the lower right position. Each pixel is divided into $N_x$ ($N_x$ is a natural number) parts in the x direction and $N_y$ ($N_y$ is a natural number) parts in the y direction, and constituted by $N_x \times N_y$ sub-pixels=number $N_{LF}$ of pupil divisions. Note that in the example shown in FIG. 20, $N_x=2$, $N_y=2$, and $N_{LF}=2\times2=4$. Each pixel is formed from a first sub-pixel 201 to a fourth sub-pixel 204. In the following explanation, each pixel is assumed to be divided as shown in FIG. 20 for the sake of simplicity. However, pixel division of this embodiment is not limited to that shown in FIG. 20. The description of this embodiment also applies to a case in which one or both of $N_x$ and $N_y$ are 3 or more. In this case, each pixel is formed from the first sub-pixel to an $N_{LF}$th sub-pixel.

In the example shown in FIG. 20, a number of sets of pixels of 4 columns×4 rows (sub-pixels of 8 columns×8 rows) are arranged on a plane, thereby acquiring an input image used to generate a captured image and four viewpoint images (the number of viewpoint images corresponds to the number $N_{FL}$ of pupil divisions). In the image sensor 107, a period P of the pixels is 6 μm (micrometers), the number $N_H$ of horizontal (column direction) pixels=6000 columns, the number $N_V$ of vertical (row direction) pixels=4000 rows, and the number N of pixels=$N_H \times N_V$=24,000,000 pixels. In addition, a period $P_s$ of the sub-pixels is 3 μm, and the number $N_s$ of sub-pixels is 12,000 columns in the horizontal direction×8000 rows in the vertical direction=96,000,000 pixels.

Figure 21A:
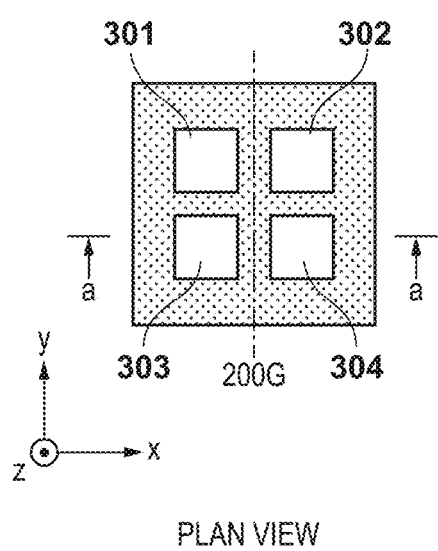
FIG. 21A is a plan view of a pixel of the image sensor 107 according to the third embodiment.
Figure 21B:
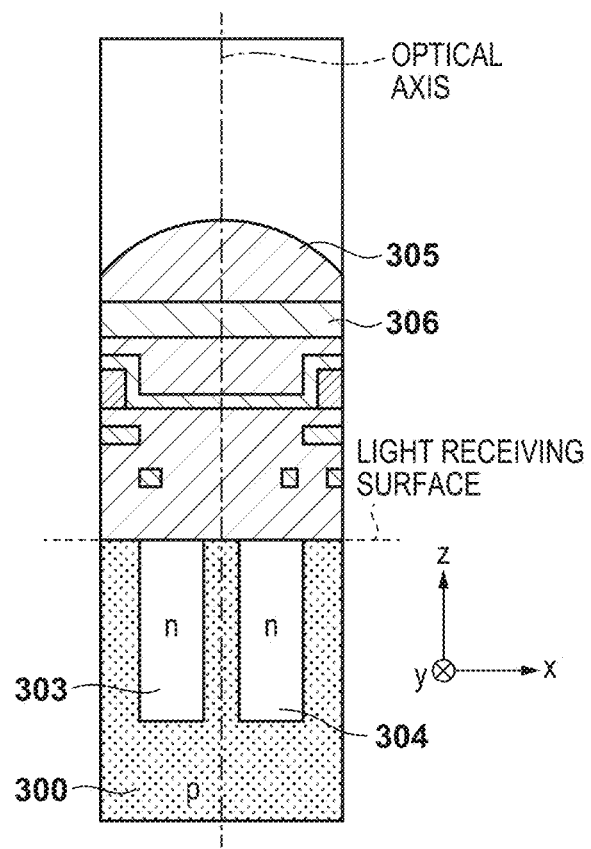
FIG. 21B is a sectional view of a pixel of the image sensor 107 according to the third embodiment.

FIG. 21A is a plan view in a case in which one pixel 200G of the image sensor 107 shown in FIG. 20 is viewed from the light receiving surface side (+z side) of the image sensor 107. A z-axis is set in a direction perpendicular to the sheet surface of FIG. 21A, and the near side is defined as the positive direction of the z-axis. A y-axis is set in the top-and-bottom direction orthogonal to the z-axis, and the upper side is defined as the positive direction of the y-axis. An x-axis set in the left-and-right direction orthogonal to the z- and y-axes, and the right side is defined as the positive direction of the x-axis. FIG. 21B is a sectional view taken along a cutting line a-a in FIG. 21A and viewed from the −y side.

As shown in FIGS. 21A and 21B, in the pixel 200G, a microlens 305 configured to condense incident light to the light receiving surface side (+z direction) of each pixel is formed. In addition, the pixel is divided into two units in the x direction and divided into two units in the y direction to form four photoelectric conversion units (a first photoelectric conversion unit 301 to a fourth photoelectric conversion unit 304). The first photoelectric conversion unit 301 to the fourth photoelectric conversion unit 304 correspond to the first sub-pixel 201 to the fourth sub-pixel 204, respectively. The arrangement of the third photoelectric conversion unit 303 and the fourth photoelectric conversion unit 304 shown in FIG. 21B is the same as the arrangement of the first photoelectric conversion unit 301 and the second photoelectric conversion unit 302 described with reference to FIG. 3B in the first embodiment.

Figure 22:
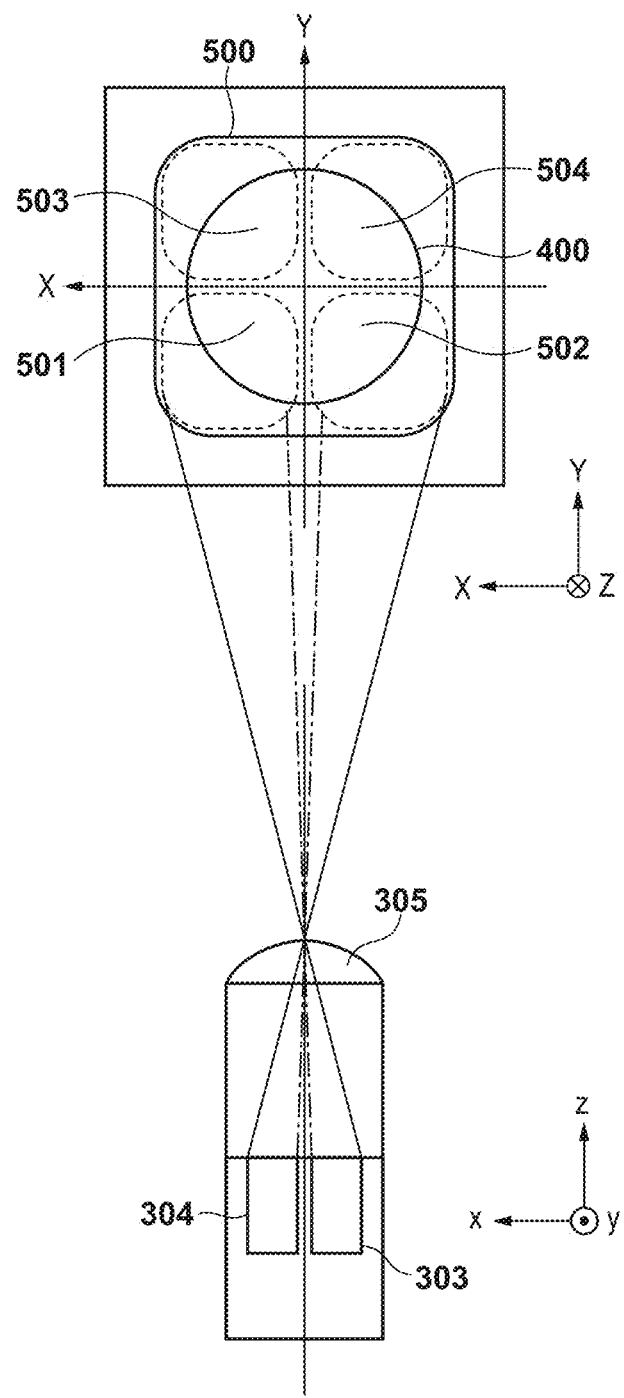
FIG. 22 is a schematic explanatory view showing the correspondence relationship between pupil division and the pixel structure of the image sensor 107 according to the third embodiment.

FIG. 22 is a schematic explanatory view showing the correspondence relationship between pupil division and the pixel structure of the image sensor 107. FIG. 22 shows a sectional view showing the section of the pixel structure taken along the line a-a in FIG. 21A, which is viewed from the +y direction, and a view of the exit pupil plane of the imaging optical system viewed from the −z direction. In FIG. 22, to attain a correspondence with the coordinate axes of the exit pupil plane, the x- and y-axes of the sectional view are reversed from the state shown in FIGS. 21A and 21B.

The image sensor 107 is arranged near the imaging plane of the imaging lens (imaging optical system). A light beam from an object passes through an exit pupil 400 of the imaging optical system and enters each pixel. The plane on which the image sensor 107 is arranged is defined as the imaging plane.

A first partial pupil region 501 to a fourth partial pupil region 504, which are 2×2-divided, have an almost optically conjugate relationship with the light receiving surfaces of the first photoelectric conversion unit 301 to the fourth photoelectric conversion unit 304 via the microlens. The first partial pupil region 501 to the fourth partial pupil region 504 are pupil regions capable of receiving light by the first sub-pixel 201 to the fourth sub-pixel 204, respectively. The first partial pupil region 501 of the first sub-pixel 201 has a center of gravity decentered to the (+X, −Y) side on the pupil plane. The second partial pupil region 502 of the second sub-pixel 202 has a center of gravity decentered to the (−X, −Y) side on the pupil plane. The third partial pupil region 503 of the third sub-pixel 203 has a center of gravity decentered to the (+X, +Y) side on the pupil plane. The fourth partial pupil region 504 of the fourth sub-pixel 204 has a center of gravity decentered to the (−X, +Y) side on the pupil plane.

In each pixel of the image sensor 107, the first sub-pixel 201 to the fourth sub-pixel 204 which are 2×2-divided respectively receive light beams that have passed through different partial pupil regions, that is, the first partial pupil region 501 to the fourth partial pupil region 504 of the imaging optical system. LF data (input image) representing the spatial distribution and angular distribution of light intensities is acquired from the signal of light received by each sub-pixel.

In the third embodiment as well, the image capturing apparatus 100 can perform s correction processing of a viewpoint image based on a captured image in accordance with the flowcharts of FIGS. 9 and 10, as in the first embodiment. However, because of the number $N_{LF}$ of pupil divisions larger than 2, several changes need to be made by, for example, generating a plurality of viewpoint images in step S902. This will be described below in detail.

In step S901, the image capturing apparatus 100 composites all signals of the first sub-pixel 201 to the fourth sub-pixel 204 on a pixel basis in accordance with equation (1). A captured image formed from RGB signals of a Bayer arrangement with a resolution corresponding to the number N of pixels (=number $N_H$ of horizontal pixels×number $H_V$ of vertical pixels) is thus generated from IF data.

In step S902, the image capturing apparatus 100 performs the operation of equation (2) for k=1 to 3, thereby generating a first viewpoint image $I_1(j,i)$ to a third viewpoint image $I_3(j,i)$ from the LF data.

In steps S903 to S907, the image capturing apparatus 100 performs shading correction processing in the x direction for a kth viewpoint image $I_k$ in accordance with equations (3A) to (6D). This processing is almost the same as in the first embodiment. In steps S903 and S905 to S907, the processes are performed only for k=1 in the first embodiment. In this embodiment, however, the same processes are performed for k=1 to 3. Additionally, in this embodiment, pupil division is performed in the y direction as well, unlike the first embodiment. Hence, shading correction processing in the y direction also needs to be performed. For this reason, the image capturing apparatus 100 performs shading correction processing in the y direction by replacing the x direction with the y direction in equations (3A) to (6D). When performing shading correction processing in two steps in the x and y directions in this way, the number $N_{LF}$ of pupil divisions for normalization includes an extra in equations (4A) to (4D). For this reason, in the second shading correction processing in the y direction, multiplication of the number $N_{LF}$ of pupil divisions for normalization is omitted in equations (4A) to (4D). A first corrected kth viewpoint image $M_1I_k$ after shading correction is thus generated.

The processes of steps S908 to S911 are performed in accordance with equations (7A) to (10), as in the first embodiment in steps S908, S909, and S911, the processes are performed only for k=1 in the first embodiment. In this embodiment, however, the same processes are performed for k=1 to 3. A fourth corrected kth viewpoint image $M_4I_k$ is thus generated.

In step S912, the image capturing apparatus 100 generates a fourth viewpoint image $I_4$ from a corrected captured image MI and the fourth corrected kth viewpoint image $M_4I_k$(k=1 to $N_{LF}$−1=1 to 3) in accordance with $$I_{N_{LF}}(j,i) = MI(j,i) - \sum_{k=1}^{N_{LF}-1} M_4I_k(j,i) \tag{17}$$

In step S913, the image capturing apparatus 100 performs shading correction processing for the fourth corrected kth viewpoint image $M_4I_k$ in accordance with equations (6A) to (6D), as in the first embodiment, thereby generating a fifth corrected kth viewpoint image $M_5I_k$. In the first embodiment, the processes are performed only for k=1. In this embodiment, however, the same processes are performed for k=1 to 3.

In steps S914 and S915, the image capturing apparatus 100 generates the shading function of the fourth viewpoint image $I_4$ and generates a fifth corrected fourth viewpoint image $M_5I_4$ from the fourth viewpoint image $I_4$, as in steps S903 to S907 of the second embodiment.

In steps S916 and S917, the image capturing apparatus 100 generates a final corrected kth viewpoint image $MI_k$ from the fifth corrected kth viewpoint image $M_5I_k$ in accordance with equation (12), as in the first embodiment. In the first embodiment, k=1 to 2. In this embodiment, however, k=1 to 4.

As described above, the first embodiment can be generalized to a case in which $N_x \geq 2$, $N_y \geq 2$, and $N_{LF} = N_x \times N_y$.

Fourth Embodiment

In the fourth embodiment, an arrangement that performs pixel shift super resolution processing for the final corrected first viewpoint image to the final corrected fourth viewpoint image generated is the third embodiment to generate an output image having a resolution higher than the resolution of each viewpoint image will be described. In this embodiment, the basic arrangement of an image capturing apparatus 100 is the same as in the third embodiment (see FIG. 1). Points different from the third embodiment will mainly be described below.

Figure 23:
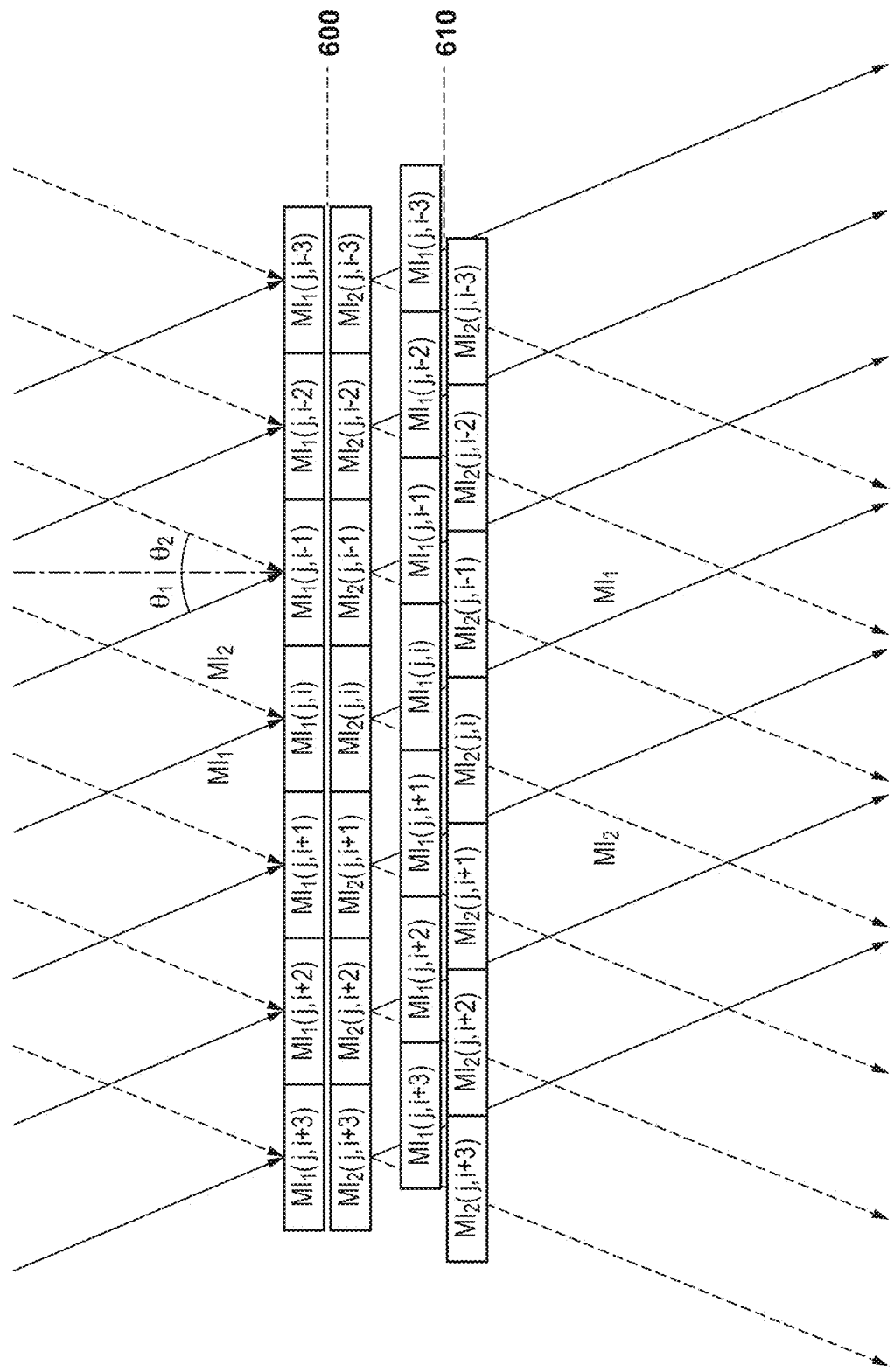
FIG. 23 is an explanatory view showing the outline of pixel shift super resolution processing by a final corrected first viewpoint image $MI_1(j,i)$ to a final corrected fourth viewpoint image $MI_4(j,i)$.

FIG. 23 is an explanatory view showing the outline of pixel shift super resolution processing by a final corrected first viewpoint image $MI_1(j,i)$ to a final corrected fourth viewpoint image $MI_4(j,i)$. In FIG. 23, an x-axis is set in the top-and-bottom direction of the sheet surface, and the lower side is defined as the positive direction of the x-axis. A direction perpendicular to the sheet surface is set to a y-axis, and the near side is defined as the positive direction of the y-axis. A z-axis is set in the left-and-right direction of the sheet surface, and the left side is defined as the positive direction of the z-axis. An imaging plane 600 shown in FIG. 23 corresponds to the imaging plane 600 shown in FIGS. 7 and 8.

In FIG. 23, of the final corrected first viewpoint image $MI_1(j,i)$ to the final corrected fourth viewpoint image $MI_4(j,i)$, the final corrected first viewpoint image $MI_1(j,i)$ and the final corrected second viewpoint image $MI_2(j,i)$ are schematically expressed. The signal of the final corrected first viewpoint image $MI_1(j,i)$ is the light reception signal of a light beam that enters a first photoelectric conversion unit 301 at a position (j, i) at a principal ray angle $\theta_1$ corresponding to a first partial pupil region 501 shown in FIG. 7. The signal of the final corrected second viewpoint image $MI_2(j,i)$ is the light reception signal of a light beam that enters a second photoelectric conversion unit 302 at the position (j, i) at a principal ray angle $\theta_2$ corresponding to a second partial pupil region 502 shown in FIG. 7.

The final corrected first viewpoint image $MI_1(j,i)$ to the final corrected fourth viewpoint image $MI_4(j,i)$ include not only light intensity distribution information but also incident angle information. Hence, one pixel shift image group on a virtual imaging plane 610 can be obtained by translation to be described below.

Translating the final corrected first viewpoint image $MI_1(j,i)$ up to the virtual imaging plane 610 along the principal ray angle $\theta_1$ is equivalent to a shift in the x direction by a $-\frac{1}{4}$ pixel and in the y direction by a $+\frac{1}{4}$ pixel. Translating the final corrected second viewpoint image $MI_2(j,i)$ up to the virtual imaging plane 610 along the principal angle $\theta_2$ equivalent to a shift in the x direction by a $+\frac{1}{4}$ pixel and in the y direction by a $+\frac{1}{4}$ pixel. Translating the final corrected third viewpoint image $MI_3(j,i)$ up to the virtual imaging plane 610 along a principal ray angle $\theta_3$ is equivalent to a shift in the a direction by a $-\frac{1}{4}$ pixel and in the y direction by a $-\frac{1}{4}$ pixel. Translating the final corrected fourth viewpoint image $MI_4(j,i)$ up to the virtual imaging plane 610 along a principal ray angle $\theta_4$ is equivalent to a shift in the x direction by a $+\frac{1}{4}$ pixel and in the y direction by a $-\frac{1}{4}$ pixel. It is therefore possible to obtain one pixel shift image group formed from the four images generated on the virtual imaging plane 610 by non-integer-shifting each of the final corrected first viewpoint image $MI_1(j,i)$ to the final corrected fourth viewpoint image $MI_4(j,i)$ in at least one of the x and y directions relatively by an amount corresponding to a $+\frac{1}{2}$ pixel.

In this embodiment, the image capturing apparatus 100 performs pixel shift super resolution processing using one pixel shift image group formed from a plurality of corrected viewpoint images including the final corrected first viewpoint image $MI_1$ to the final corrected fourth viewpoint image $MI_4$. With this arrangement, it is possible to generate an output image having a resolution higher than a resolution corresponding to the number N of pixels of each corrected viewpoint image.

In the first viewpoint image to the fourth viewpoint image according to this embodiment, a pupil shift may occur between an exit pupil 400 of the imaging optical system and the entrance pupil of an image sensor 107, the pupil division may be uneven, and different shading states may occur for the RGB components of each viewpoint image, as described with reference to FIGS. 11A to 11C. It may be impossible to sufficiently improve the resolution by pixel shift super resolution processing using one pixel shift image group formed from a plurality of viewpoint images in largely different shading states without performing shading (light amount) correction for each of the RGB components of the first viewpoint image to the fourth viewpoint image.

Hence, in this embodiment, the image capturing apparatus 100 forms one pixel shift image group from the final corrected first viewpoint image to the final corrected fourth viewpoint image, which have undergone accurate shading correction processing for each of the RGB components based on the captured image, and generates an output image by pixel shift super resolution processing. It is therefore possible to generate an output image having a resolution higher than a resolution corresponding to the number N of pixels of each corrected viewpoint image.

Note that in the pixel shift super resolution processing, it is not essential to use all of the final corrected first viewpoint image to the final corrected fourth viewpoint image. For example, even if only the final corrected first viewpoint image and the final corrected second viewpoint image are used, the effect of increasing the resolution in the x direction can be obtained.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2016-112101, filed Jun. 3, 2016 and No. 2016-143735, filed Jul. 21, 2016, which are hereby incorporated by reference herein in their entirety.

What is claimed is:

1. An image processing apparatus comprising a controller having a processor which executes instructions stored in a memory or having circuitry, the controller being configured to function as:
   an acquisition unit configured to acquire a first viewpoint image corresponding to a first partial pupil region of an exit pupil of an imaging optical system divided into a plurality of partial pupil regions in a first direction, and a captured image corresponding to the exit pupil; and
   a correction unit configured to correct shading of a first pixel of a first pixel group based on a first ratio of a sum of pixel values of the first pixel group of the first viewpoint image arranged in a second direction orthogonal to the first direction to a sum of pixel values of a pixel group of the captured image corresponding to a position of the first pixel group,
   wherein each pixel of the first viewpoint image and the captured image corresponds to one of a plurality of colors, and
   the correction unit decides the first pixel group such that all pixels of the first pixel group correspond to a single color.

2. The apparatus according to claim 1, wherein if (the sum of pixel values of the pixel group of the captured image)> (the sum of pixel values of the first pixel group)>0,
   the correction unit corrects the shading of the first pixel based on the first ratio.

3. The apparatus according to claim 1, wherein the acquisition unit further acquires a second viewpoint image corresponding to a second partial pupil region of the plurality of partial pupil regions,
   the correction unit corrects shading of a second pixel of a second pixel group based on a second ratio of a sum of pixel values of the second pixel group of the second viewpoint image arranged in the second direction and including the second pixel corresponding to a position of the first pixel of the first viewpoint image to a sum of pixel values of a pixel group of the captured image corresponding to a position of the second pixel group, and
   the controller is further configured to function as a generation unit configured to generate an image having a resolution higher than that of the first viewpoint image and the second viewpoint image by performing pixel shift super resolution processing using the first viewpoint image and the second viewpoint image after correction by the correction unit.

4. The apparatus according to claim 1, wherein the first partial pupil region is one of the plurality of partial pupil regions of the exit pupil divided into a plurality of parts in the first direction and also divided into a plurality of parts in the second direction, and
   the correction unit corrects the shading of the first pixel further based on a third ratio of a sum of pixel values of a third pixel group of the first viewpoint image arranged in the first direction and including the first pixel to a sum of pixel values of a pixel group of the captured image corresponding to a position of the third pixel group.

5. The apparatus according to claim 1, further comprising a focus detection unit,
   wherein when using the first viewpoint image for focus detection, the correction unit switches the correction of shading so as to correct the shading of the first pixel of the first pixel group based on correction associated data recorded in advance, and
   the focus detection unit calculates a defocus amount based on an image corrected by the correction unit and generates a focus detection signal based on the defocus amount.

6. An image capturing apparatus comprising:
   an image sensor in which a plurality of pixels each including a plurality of sub-pixels each configured to receive a light beam corresponding to a different partial pupil region of an exit pupil of an imaging optical system divided into a plurality of partial pupil regions in a first direction are arrayed; and
   the image processing apparatus according to claim 1.

7. An image processing apparatus comprising a controller having a processor which executes instructions stored in a memory or having circuitry, the controller being configured, to function as:
   an acquisition unit configured to acquire a first viewpoint image corresponding to a first partial pupil region of an exit pupil of an imaging optical system divided into a plurality of partial pupil regions in a first direction, and a captured image corresponding to the exit pupil; and a correction unit configured to correct shading of a first pixel of a first pixel group based on a first ratio of a sum of pixel values of the first pixel group of the first viewpoint image arranged in a second direction orthogonal to the first direction to a sum of pixel values of a pixel group of the captured image corresponding to a position of the first pixel group,
   wherein when a predetermined pixel of the first viewpoint image does not have an effective value, or a pixel of the captured image corresponding to a position of the predetermined pixel does not have an effective value, the correction unit excludes the predetermined pixel from the first pixel group when calculating the sum of pixel values of the first pixel group of the first viewpoint image.

8. The apparatus according to claim 7, wherein the correction unit determines at least one of a saturated pixel and a defective pixel as the pixel that does not have the effective value.

9. The apparatus according to claim 7, wherein if (the sum of pixel values of the pixel group of the captured image)> (the sum of pixel values of the first pixel group)>0,
   the correction unit corrects the shading of the first pixel based on the first ratio.

10. The apparatus according to claim 7, wherein the acquisition unit further acquires a second viewpoint image corresponding to a second partial pupil region of the plurality of partial pupil regions,
    the correction unit corrects shading of a second pixel of a second pixel group based on a second ratio of a sum of pixel values of the second pixel group of the second viewpoint image arranged in the second direction and including the second pixel corresponding to a position of the first pixel of the first viewpoint image to a sum of pixel values of a pixel group of the captured image corresponding to a position of the second pixel group, and
    the controller is further configured to function as a generation unit configured to generate an image having a resolution higher than that of the first viewpoint image and the second viewpoint image by performing pixel shift super resolution processing using the first viewpoint image and the second viewpoint image after correction by the correction unit.

11. The apparatus according to claim 7, wherein the first partial pupil region is one of the plurality of partial pupil regions of the exit pupil divided into a plurality of parts in the first direction and also divided into a plurality of parts in the second direction, and the correction unit corrects the shading of the first pixel further based on a third ratio of a sum of pixel values of a third pixel group of the first viewpoint image arranged in the first direction and including the first pixel to a sum of pixel values of a pixel group of the captured image corresponding to a position of the third pixel group.

12. The apparatus according to claim 7, further comprising a focus detection unit, wherein when using the first viewpoint image for focus detection, the correction unit switches the correction of shading so as to correct the shading of the first pixel of the first pixel group based on correction associated data recorded in advance, and the focus detection unit calculates a defocus amount based on an image corrected by the correction unit and generates a focus detection signal based on the defocus amount.

13. An image capturing apparatus comprising:

an image sensor in which a plurality of pixels each including a plurality of sub-pixels each configured to receive a light beam corresponding to a different partial pupil region of an exit pupil of an imaging optical system divided into a plurality of partial pupil regions in a first direction are arrayed; and the image processing apparatus according to claim 7.

14. An image processing method in which an image processing apparatus performs, the method having:

acquiring a first viewpoint image corresponding to a first partial pupil region of an exit pupil of an imaging optical system divided into a plurality of partial pupil regions in a first direction, and a captured image corresponding to the exit pupil; and correcting shading of a first pixel of a first pixel group based on a first ratio of a sum of pixel values of the first pixel group of the first viewpoint image arranged in a second direction orthogonal to the first direction to a sum of pixel values of a pixel group of the captured image corresponding to a position of the first pixel group, wherein each pixel of the first viewpoint image and the captured image corresponds to one of a plurality of colors, and the correction unit decides the first pixel group such that all pixels of the first pixel group correspond to a single color.

15. A non-transitory computer-readable storage medium storing a program for causing a computer to execute the image processing method according to claim 14.

16. An image processing method in which an image processing apparatus performs, the method having;

acquiring a first viewpoint image corresponding to a first partial pupil region of an exit pupil of an imaging optical system divided into a plurality of partial pupil regions in a first direction, and a captured image corresponding to the exit pupil; and correcting shading of a first pixel of a first pixel group based on a first ratio of a sum of pixel values of the first pixel group of the first viewpoint image arranged in a second direction orthogonal to the first direction to a sum of pixel values of a pixel group of the captured image corresponding to a position of the first pixel group, wherein when a predetermined pixel of the first viewpoint image does not have an effective value, or a pixel of the captured image corresponding to a position of the predetermined pixel does not have an effective value, the correcting shading of the first pixel of the first pixel group includes excluding the predetermined pixel from the first pixel group when calculating the sum of pixel values of the first pixel group of the first viewpoint image.

* * * * *